US012777638B2

(12) United States Patent
Chen et al.

(10) Patent No.: US 12,777,638 B2
(45) Date of Patent: Oct. 27, 2026

(54) BACKSIDE METAL ROM DEVICE, LAYOUT, AND METHOD

(71) Applicant: TAIWAN SEMICONDUCTOR MANUFACTURING COMPANY, LTD., Hsinchu (TW)

(72) Inventors: Chien-Ying Chen, Hsinchu (TW); Ku-Feng Lin, Hsinchu (TW); Preciliano Asinas Ruiz, Jr., Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 334 days.

(21) Appl. No.: 18/661,093

(22) Filed: May 10, 2024

(65) Prior Publication Data

US 2025/0203856 A1 Jun. 19, 2025

Related U.S. Application Data

(60) Provisional application No. 63/611,522, filed on Dec. 18, 2023.

(51) Int. Cl.
*H10B 20/20* (2023.01)

(52) U.S. Cl.
CPC .................................... *H10B 20/20* (2023.02)

(58) Field of Classification Search
CPC ........ H10B 20/20; H10B 20/34; H10B 20/00; H10D 89/10
See application file for complete search history.

(56) References Cited

U.S. PATENT DOCUMENTS

| | | | | |
|---|---|---|---|---|
| 12,563,713 B2 * | 2/2026 | Chen | ...................... | H10B 10/12 |
| 2021/0225830 A1 * | 7/2021 | Liu | ...................... | G06F 30/392 |
| 2022/0102266 A1 * | 3/2022 | Lim | ...................... | H10D 30/031 |
| 2023/0067140 A1 * | 3/2023 | Chen | ...................... | G06F 30/392 |
| 2023/0068280 A1 * | 3/2023 | Lin | ...................... | G06F 30/347 |
| 2024/0064950 A1 * | 2/2024 | Chen | ...................... | H10B 10/12 |
| 2024/0147684 A1 * | 5/2024 | Liaw | ...................... | G11C 11/412 |
| 2024/0215256 A1 * | 6/2024 | Sharma | .................. | H10B 53/10 |
| 2024/0251541 A1 * | 7/2024 | Chung | ................... | G11C 5/063 |
| 2024/0260261 A1 * | 8/2024 | Nevers | .................. | H10B 20/34 |

(Continued)

FOREIGN PATENT DOCUMENTS

| | | |
|---|---|---|
| CN | 113421880 | 9/2021 |
| CN | 114203720 | 3/2022 |

(Continued)

*Primary Examiner* — Victor A Mandala
(74) *Attorney, Agent, or Firm* — Hauptman Ham, LLP

(57) ABSTRACT

A read-only memory (ROM) array includes first through fourth rows of four ROM bits positioned along respective first through fourth active areas in a front side of a semiconductor substrate, first through fourth metal lines aligned with the first through fourth active areas in a first direction and positioned in a first frontside metal layer of the semiconductor substrate, and fifth through eighth metal lines aligned with the first through fourth active areas in the first direction and positioned in a first backside metal layer of the semiconductor substrate. The first through fourth metal lines include one of bit lines or source lines of the ROM array, and the fifth through eighth metal lines include the other of the bit lines or the source lines of the ROM array.

20 Claims, 16 Drawing Sheets

(56) References Cited

U.S. PATENT DOCUMENTS

| | | | | |
|---|---|---|---|---|
| 2024/0341092 | A1* | 10/2024 | Lin | H10B 20/34 |
| 2024/0414906 | A1* | 12/2024 | Wang | G11C 11/412 |
| 2024/0414907 | A1* | 12/2024 | Wang | H10B 10/125 |
| 2025/0048610 | A1* | 2/2025 | Liaw | G11C 11/412 |
| 2025/0081580 | A1* | 3/2025 | Liaw | H10D 30/43 |
| 2025/0131958 | A1* | 4/2025 | Wang | G11C 11/412 |
| 2025/0159858 | A1* | 5/2025 | Wang | H10D 89/10 |
| 2025/0203859 | A1* | 6/2025 | Ruiz, Jr. | H10B 20/387 |
| 2026/0107546 | A1* | 4/2026 | Xu | H10D 64/017 |

FOREIGN PATENT DOCUMENTS

| | | |
|---|---|---|
| TW | 202224141 | 6/2022 |
| TW | 202312440 | 3/2023 |
| TW | 202315098 | 4/2023 |
| TW | 202329457 | 7/2023 |

* cited by examiner

BACKSIDE METAL ROM DEVICE, LAYOUT, AND METHOD

PRIORITY CLAIM

The present application claims the priority of U.S. Provisional Application No. 63/611,522, filed Dec. 18, 2023, which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
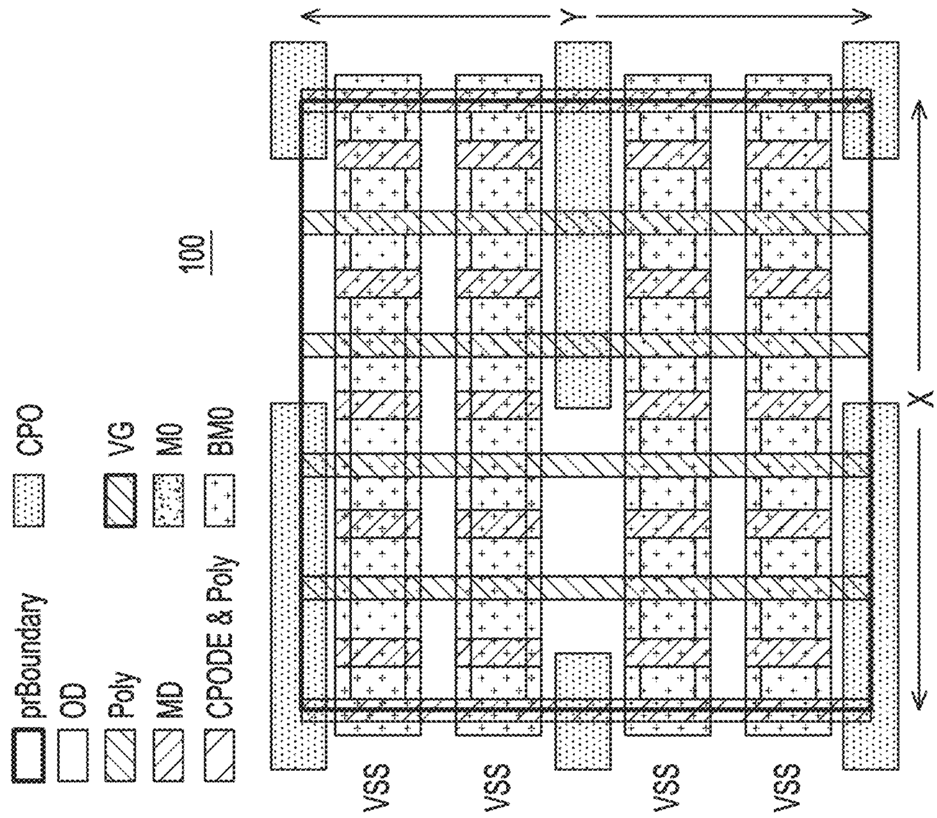
FIGS. 1A and 1B are plan views of front and back sides of an IC device and layout diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an integrated circuit (IC) device and corresponding layout diagram and manufacturing method include four rows of four read-only memory (ROM) bits of a ROM array positioned on four active areas, first metal lines positioned above the active areas in a first frontside metal layer, and second metal lines positioned below the active areas in a first backside metal layer. The first metal lines include one of bit lines or source lines of the ROM array, and the second metal lines include the other of the ROM array bit lines or source lines.

Compared to other approaches, e.g., those in which both bit lines and source lines are positioned in a frontside metal layer, the IC device is thereby capable of having a smaller overall area and increased bit line and source line widths and thereby lower resistance.

Figure 5:
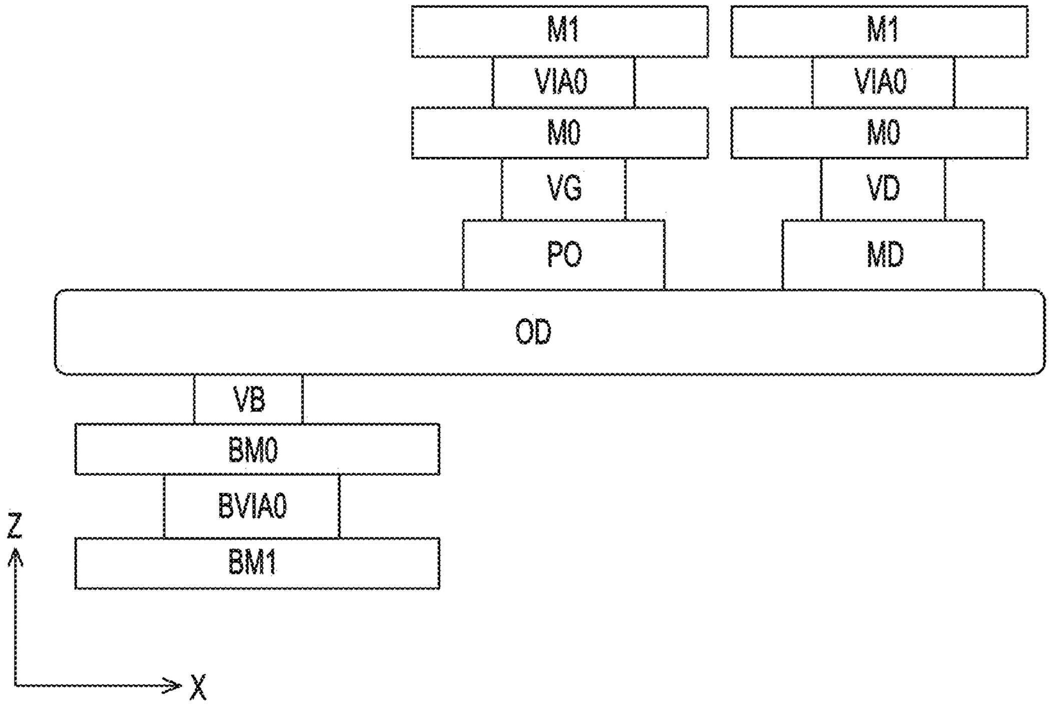
FIG. 5 is a side view of an IC device and layout diagram, in accordance with some embodiments.
Figure 6:
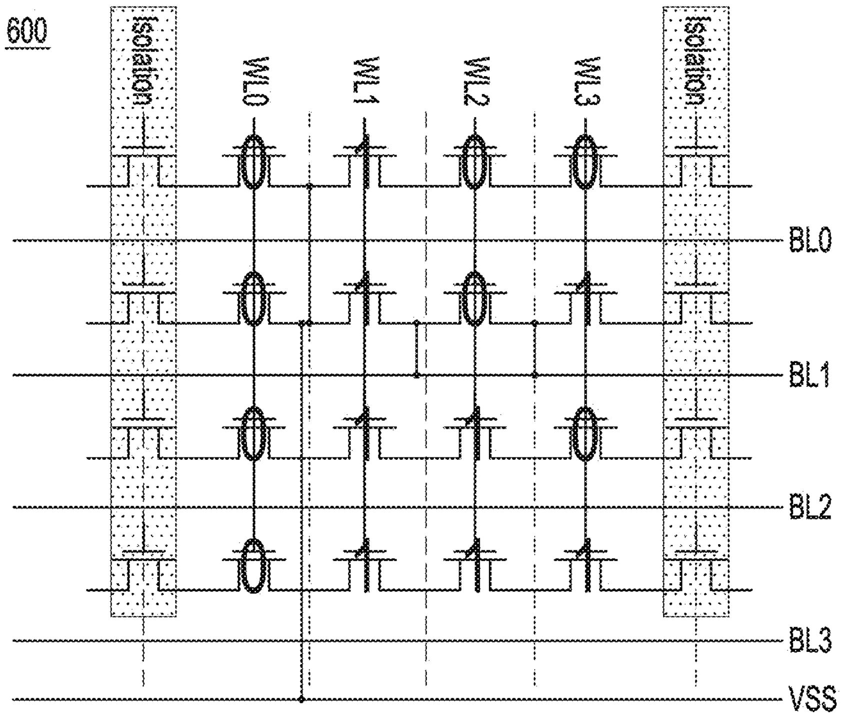
FIG. 6 is a schematic diagram of an IC device and layout diagram, in accordance with some embodiments.
Figure 7B:
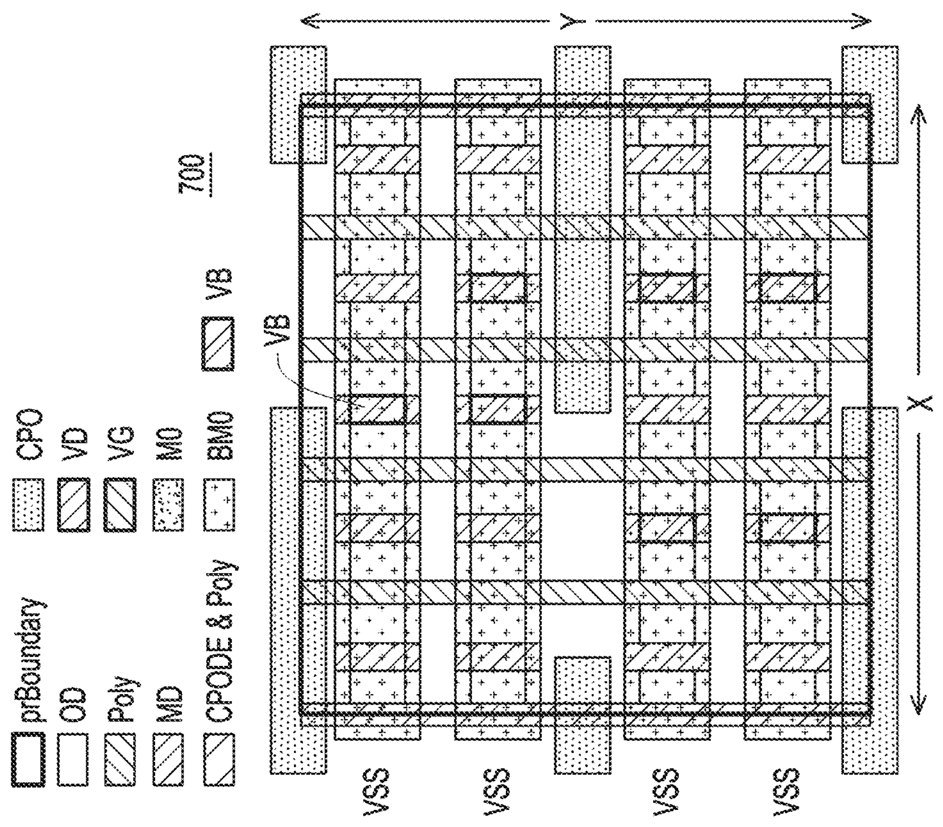
FIGS. 7A and 7B are plan views of front and back sides of an IC device and layout diagram, in accordance with some embodiments.
Figure 7A:
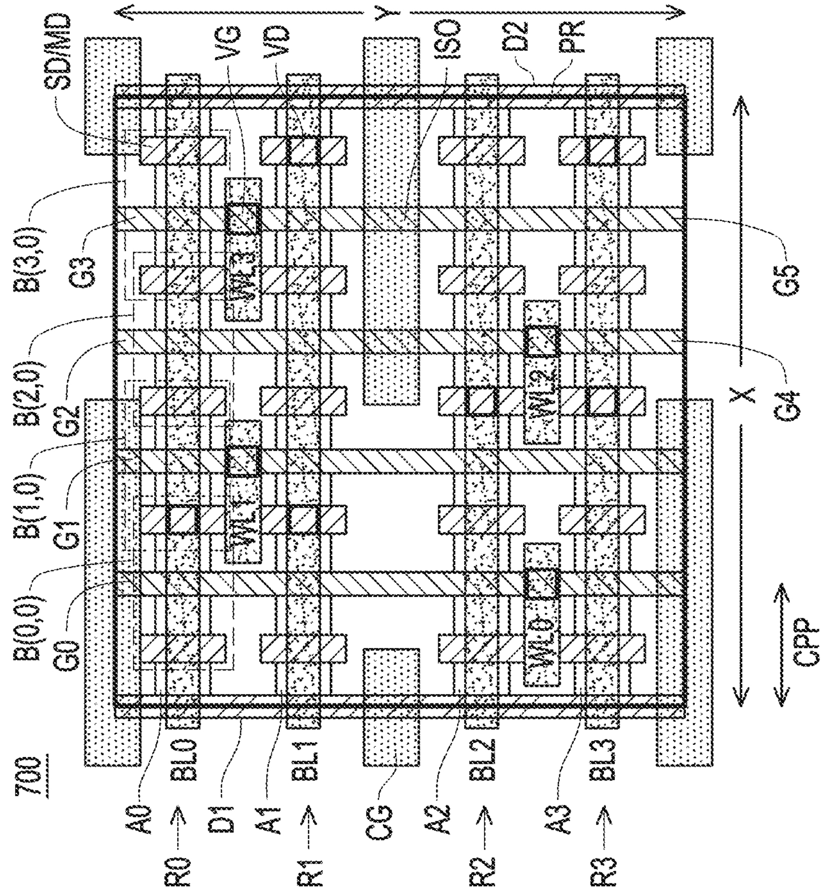
Figure 8A:
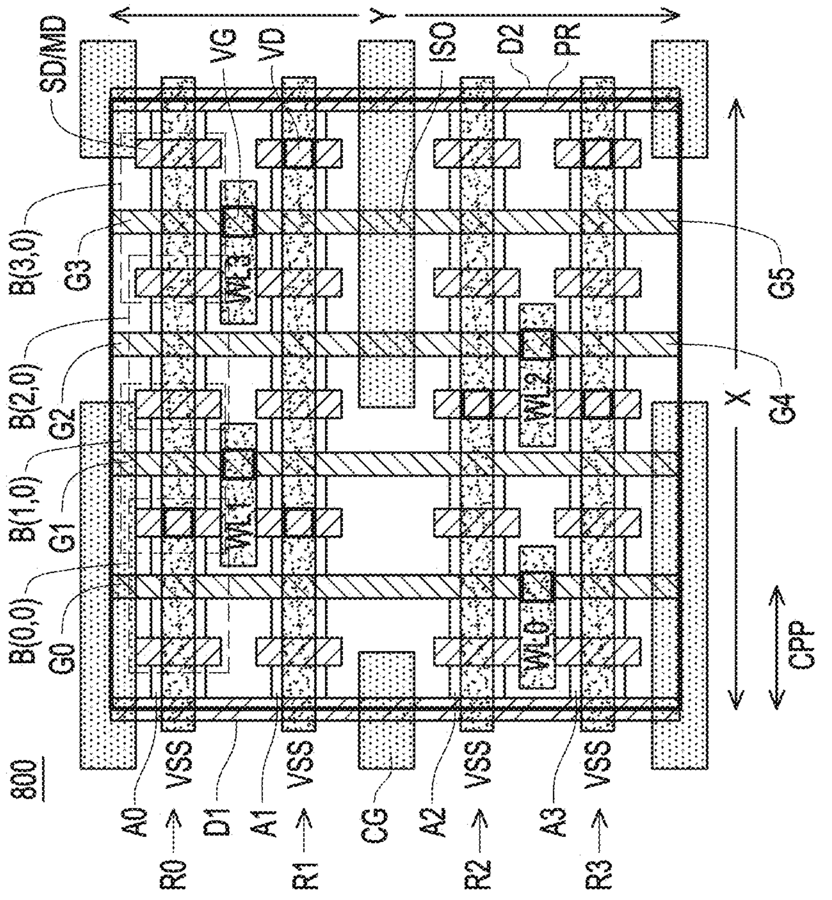
FIGS. 8A and 8B are plan views of front and back sides of an IC device and layout diagram, in accordance with some embodiments.
Figure 8B:
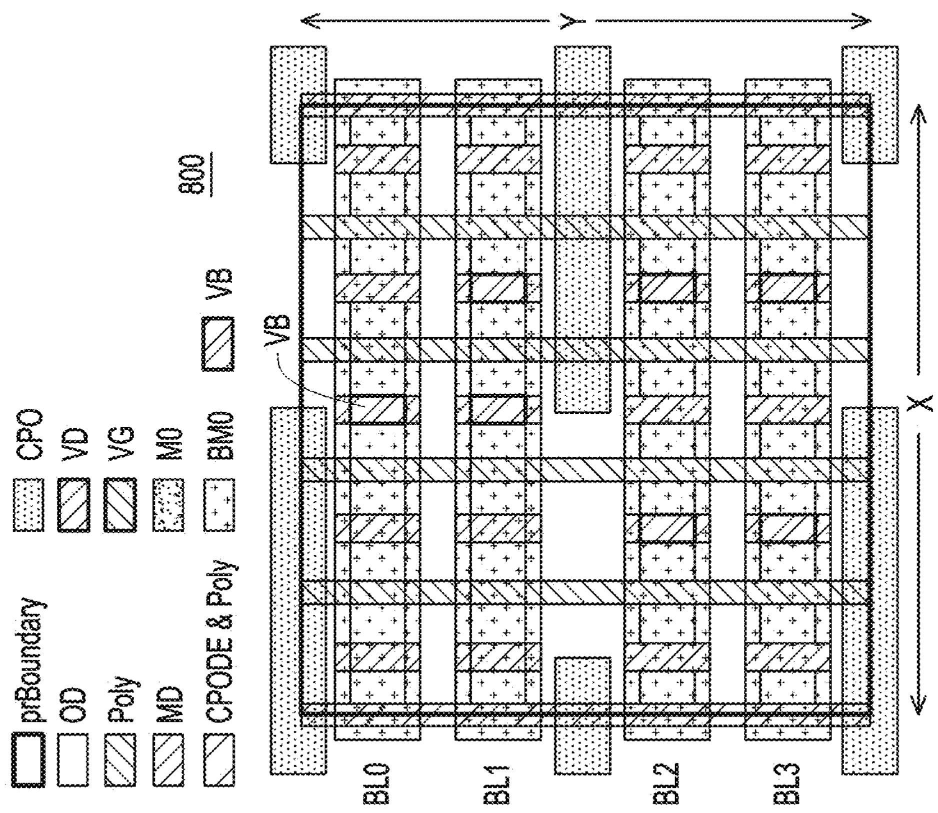
Figure 9B:
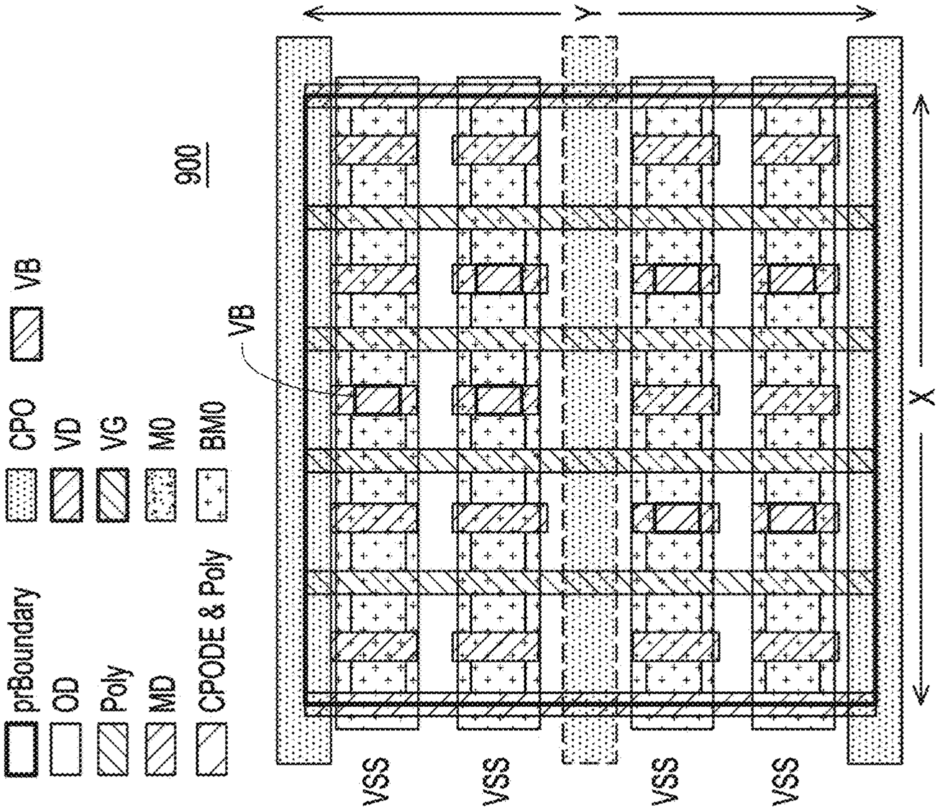
FIGS. 9A and 9B are plan views of front and back sides of an IC device and layout diagram, in accordance with some embodiments.
Figure 9A:
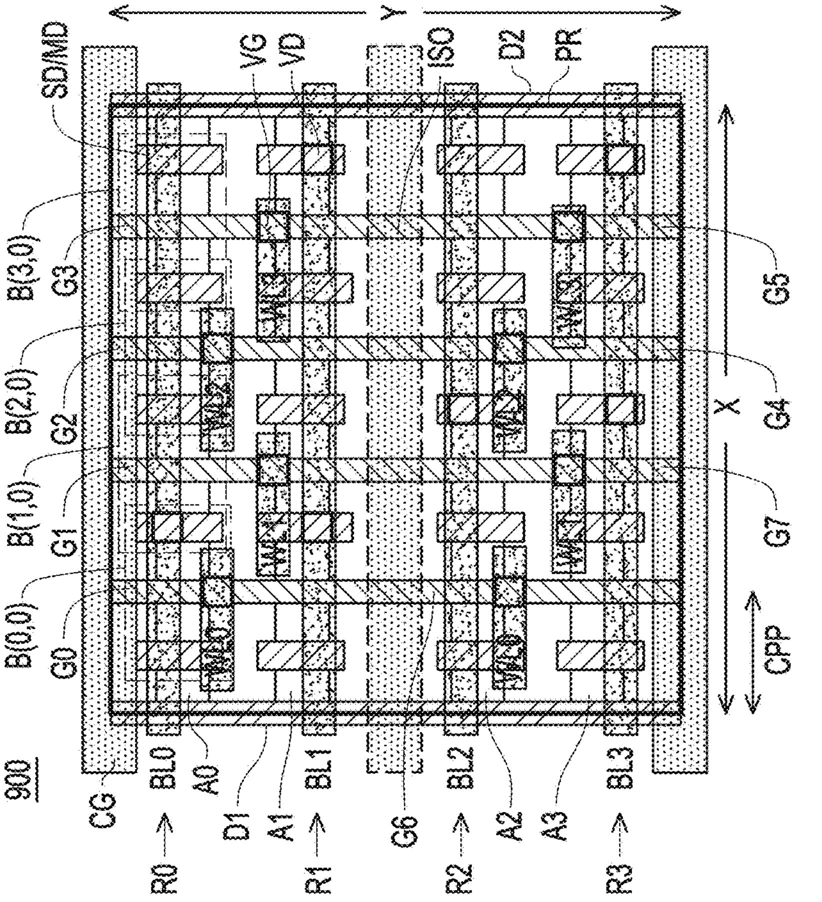
Figure 10B:
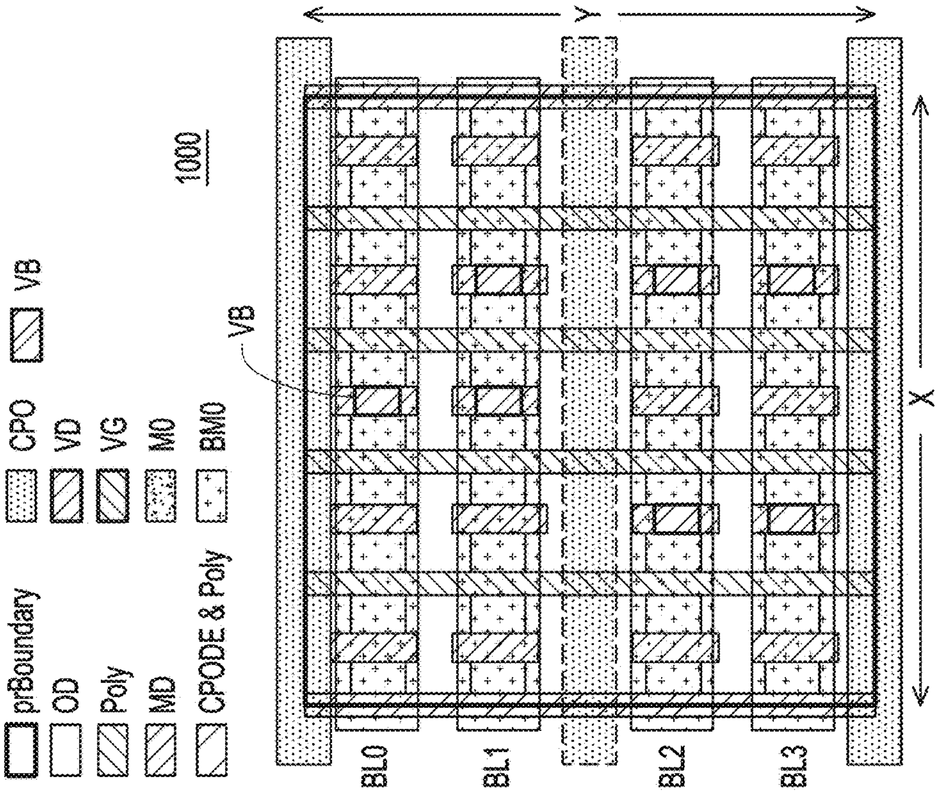
FIGS. 10A and 10B are plan views of front and back sides of an IC device and layout diagram, in accordance with some embodiments.
Figure 10A:
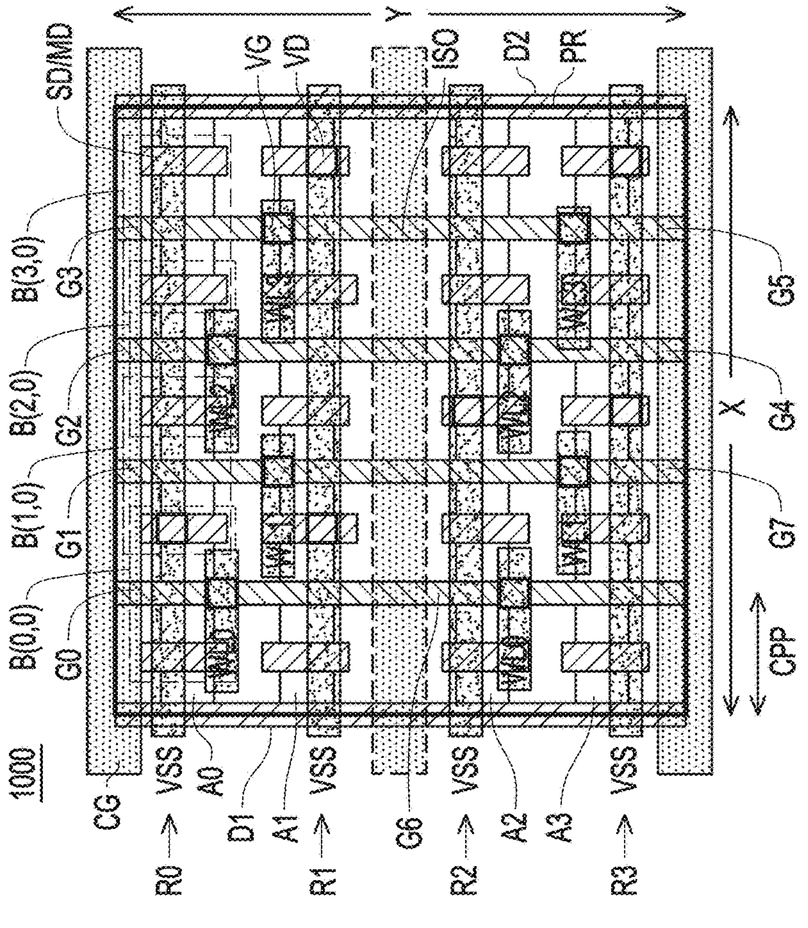
Figure 11:
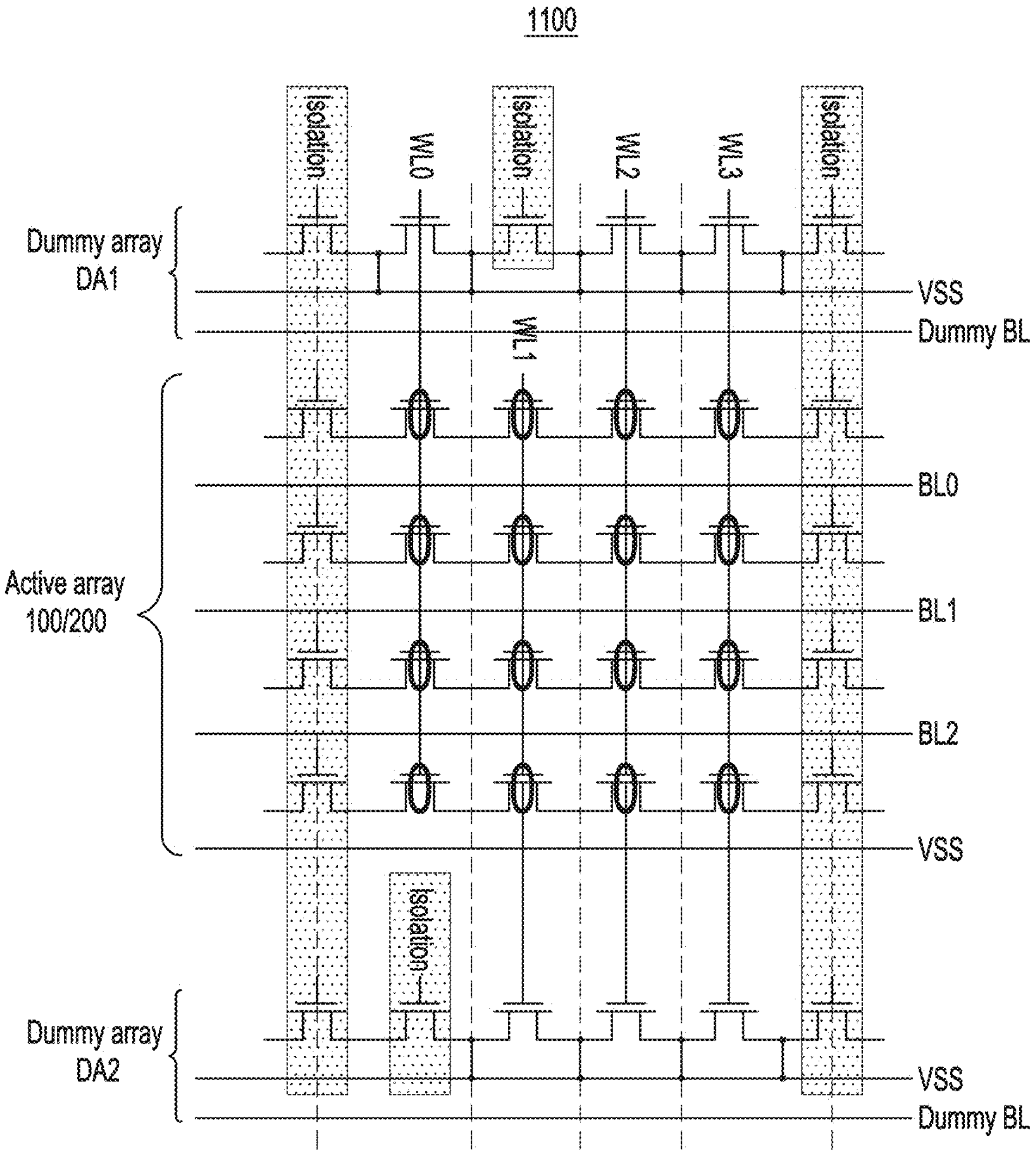
FIG. 11 is a schematic diagram of an IC device and layout diagram, in accordance with some embodiments.
Figure 14:
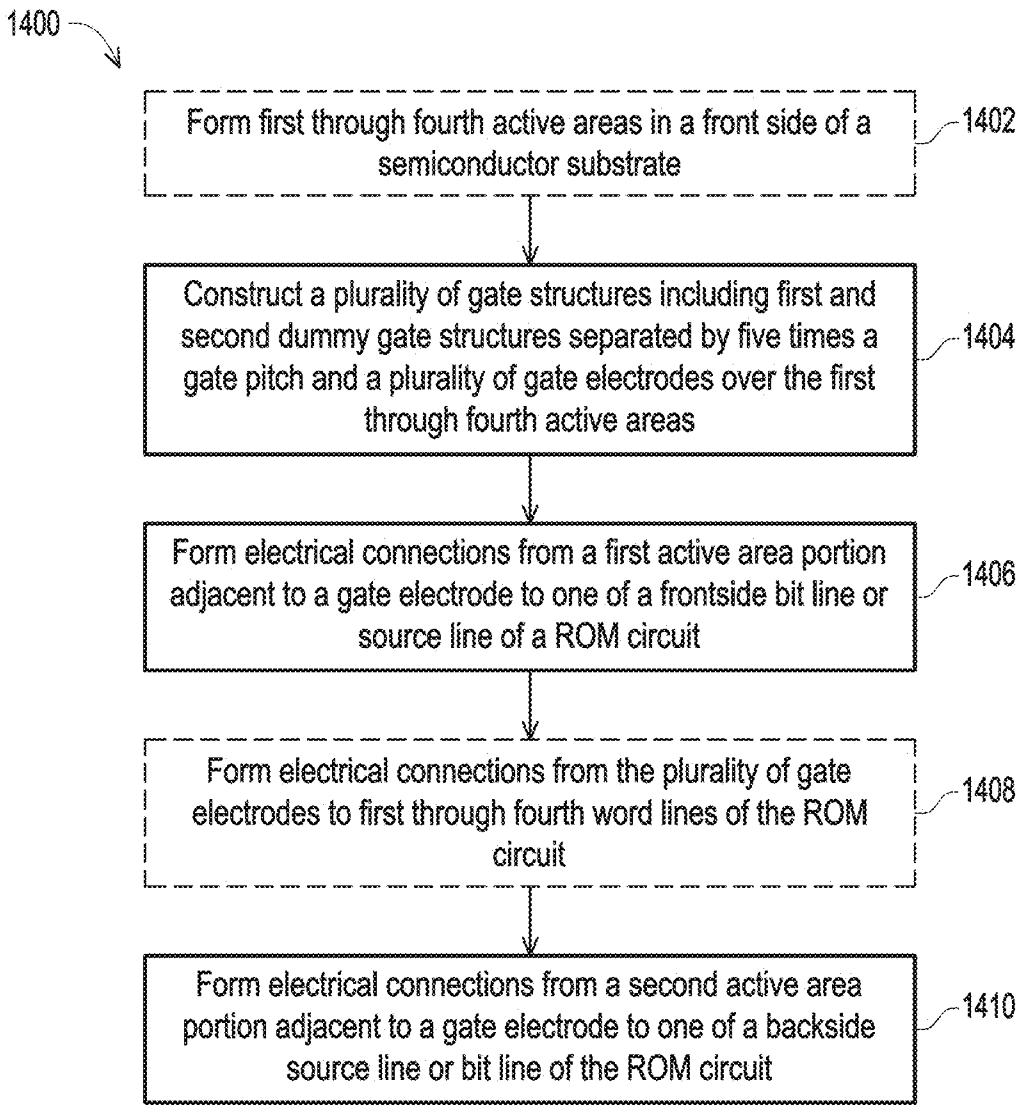
FIG. 14 is a flowchart of a method of manufacturing an IC, in accordance with some embodiments.
Figure 15:
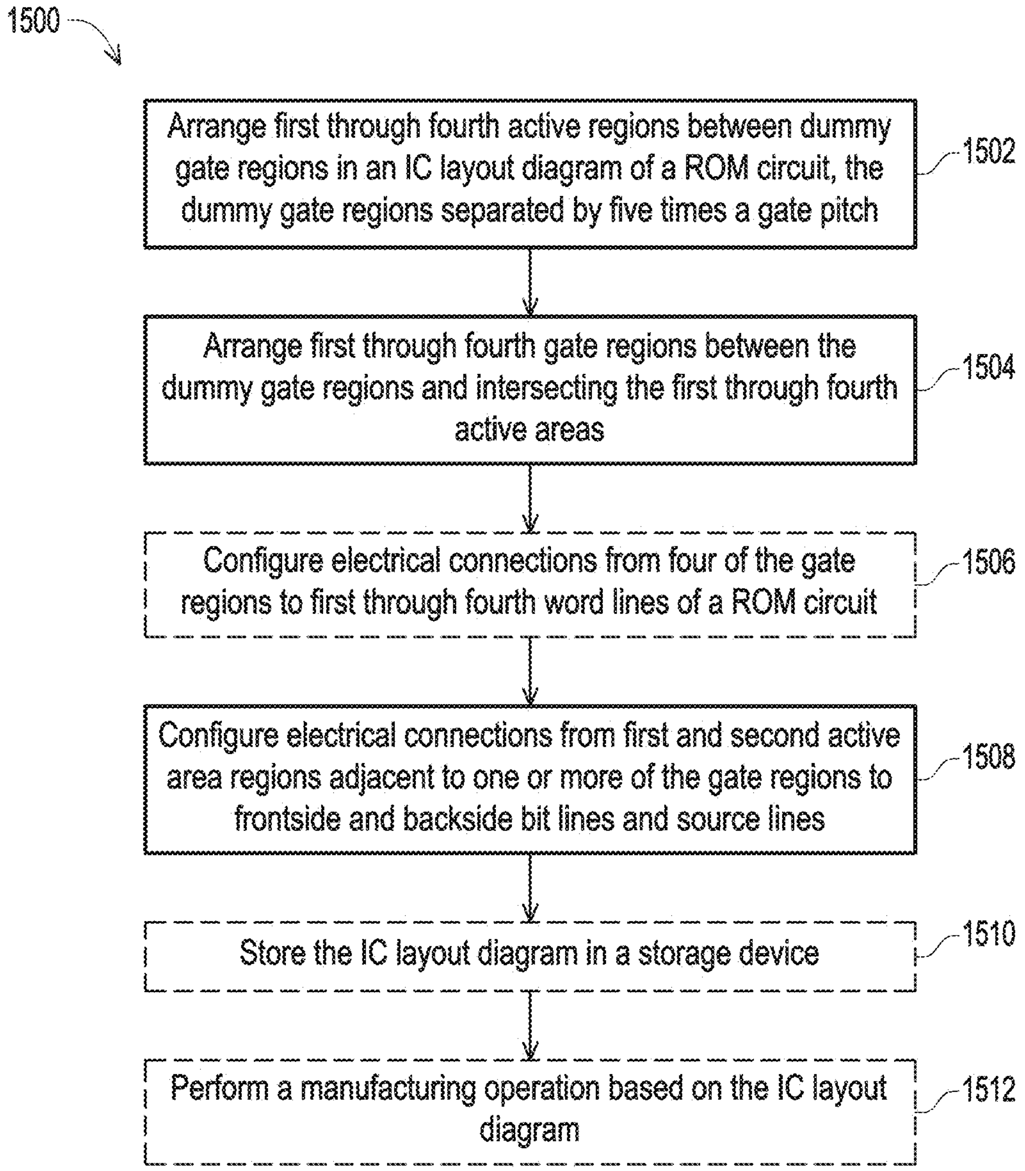
FIG. 15 is a flowchart of a method of generating an IC layout diagram, in accordance with some embodiments.

As discussed below, in accordance with various embodiments, FIGS. 1A/1B, 2A/2B, 3A/3B and 4A/4B depict plan views of front and back sides of NOR-type ROM IC devices/layout diagrams 100-400, FIG. 5 is a side view of an IC device/layout diagram, FIG. 6 is a schematic diagram 600 of an IC, FIGS. 7A/7B, 8A/8B, 9A/9B and 10A/10B depict plan views of front and back sides of NOR-type ROM IC devices/layout diagrams 700-1000 corresponding to the programmed state of schematic diagram 600, FIG. 11 is a schematic diagram 1100 of an IC device/layout diagram, FIGS. 12A/12B and 13A/13B depict plan views of front and back sides of NOR-type ROM IC devices/layout diagrams 1200 and 1300 corresponding to schematic diagram 1100, FIG. 14 is a flowchart of a method 1400 of manufacturing a NOR-type ROM IC based on a corresponding one or more of IC layout diagrams 100-400, 700-1000, 1200, or 1300, FIG. 15 is a flowchart of a method 1500 of generating one or more of IC layout diagrams 100-400, 700-1000, 1200, or 1300, e.g., using a system 1600 discussed below with respect to FIG. 16 and/or, e.g., in accordance with an IC manufacturing flow associated with an IC manufacturing system 1700 discussed below with respect to FIG. 17.

Each of the figures herein, e.g., FIGS. 1A-5, 7A-10B, 12, and 13 is simplified for the purpose of illustration. The figures are views of IC structures, devices, and layout diagrams with various features included and excluded to facilitate the discussion below. In various embodiments, an IC structure, device and/or layout diagram includes one or more features corresponding to power distribution structures, metal interconnects, contacts, vias, gate structures, source/drain (S/D) structures, bulk connections, or other transistor elements, isolation structures, or the like, in addition to the features depicted in FIGS. 1A-5, 7A-10B, 12, and 13.

In each of IC devices/layout diagrams 1A-5, 7A-10B, 12, and 13, reference designators represent both IC device features and the IC layout features used to at least partially define the corresponding IC device features in a manufacturing process, e.g., method 1400 discussed below with respect to FIG. 14 and/or the IC manufacturing flow associated with IC manufacturing system 1700 discussed below with respect to FIG. 17. Accordingly, each of IC devices/layout diagrams 100-400, 700-1000, 1200, and 1300 represents a view of both an IC layout diagram 100-400, 700-1000, 1200, and 1300 and a corresponding IC device 100-400, 700-1000, 1200, and 1300.

Figure 1A:
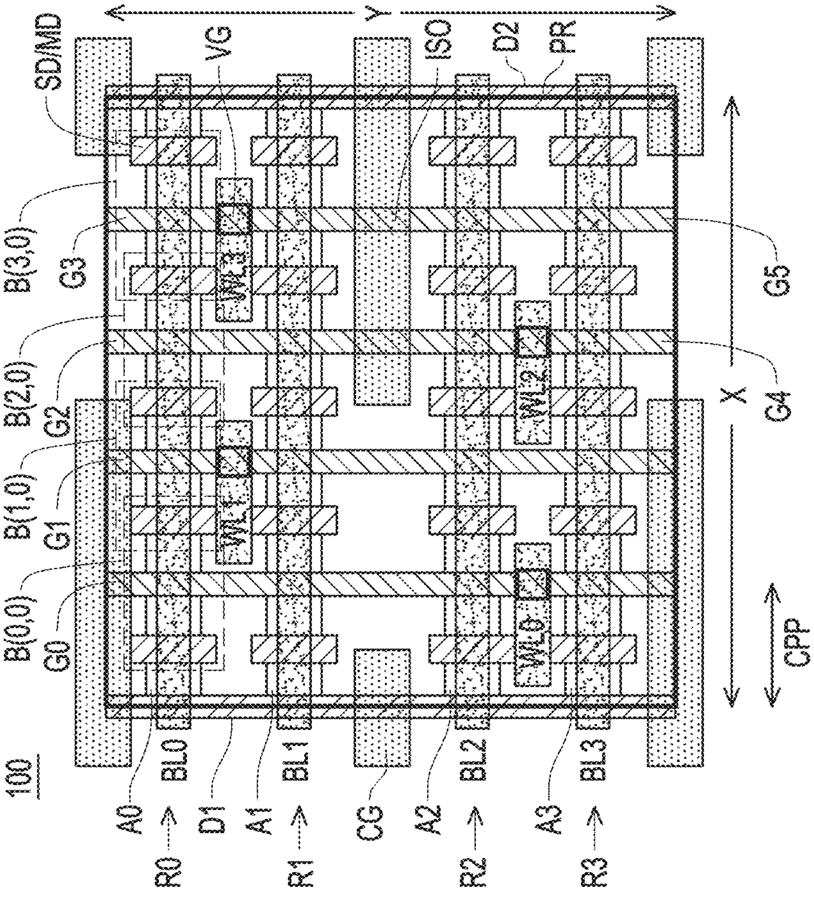
Figure 2B:
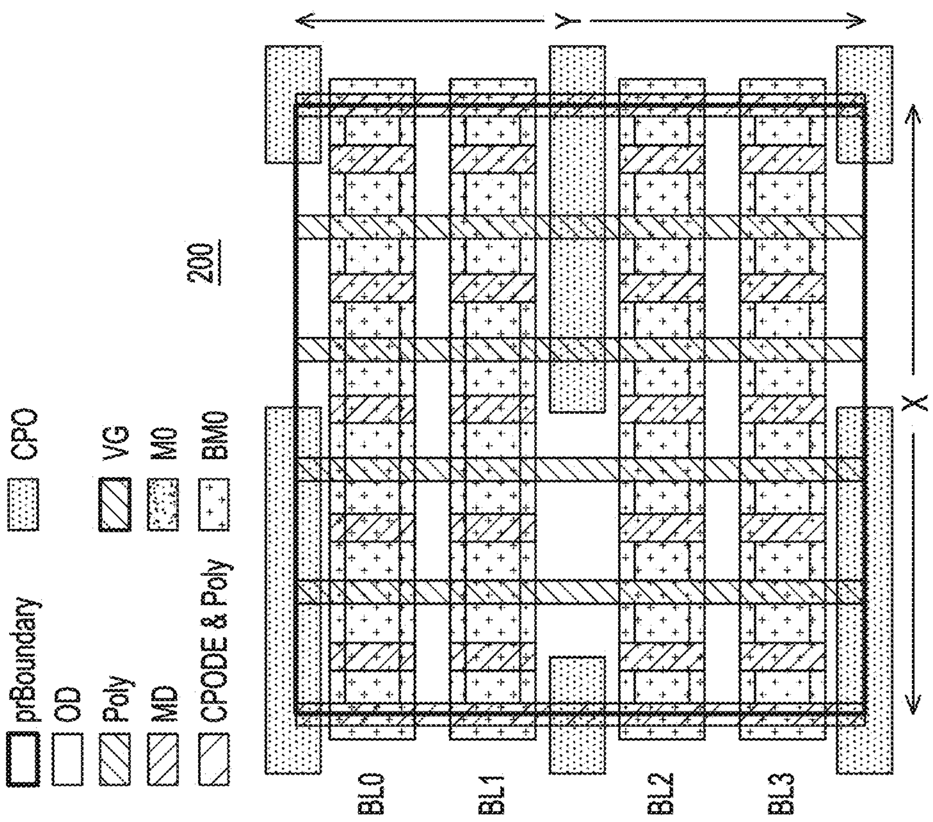
FIGS. 2A and 2B are plan views of front and back sides of an IC device and layout diagram, in accordance with some embodiments.
Figure 2A:
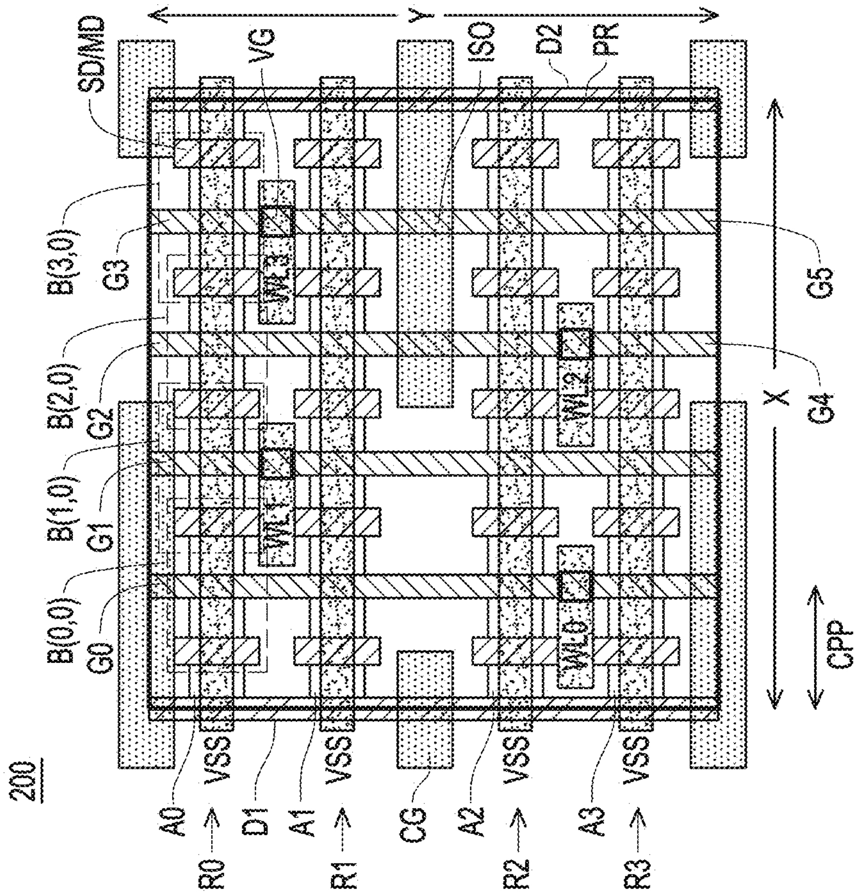

FIGS. 1A and 1B depict respective frontside and backside plan views of IC device/layout diagram 100, X and Y directions, and a key corresponding to the features discussed below, in accordance with some embodiments. FIGS. 2A and 2B depict respective frontside and backside plan views of IC device/layout diagram 200, the X and Y directions, and the key, in accordance with some embodiments. IC devices/layout diagrams 100 and 200, also referred to as ROM arrays 100 and 200 in some embodiments, include most features in common with the exception of bit lines BL0-BL3 and source lines VSS, as discussed below.

Each of IC devices/layout diagrams 100 and 200, includes active regions/areas A0-A3 extending in the X direction, in some embodiments referred to as adjacent active regions/areas based on an IC device/layout diagram 100 or 200 being free from including additional active regions/areas between active regions/areas A0-A3.

Each active region/area A0-A3 extends from a dummy gate region/structure D1 to a dummy gate region/structure D2, each of which extends in the Y direction, and gate regions/structures G0-G5 extend in the Y direction between dummy gate regions/structures D1 and D2. Each of gate regions/structures G0 and G1 intersects/overlaps each of active regions/areas A0-A3, each of gate regions/structures G2 and G3 intersects/overlaps each of active regions/areas A0 and A1, and each of gate regions/structures G4 and G5 intersects/overlaps each of active regions/areas A2 and A3.

Gate region/structure G0 is offset from dummy gate region/structure D1 in the positive X direction by a pitch CPP, also referred to as a contact poly pitch CPP in some embodiments. Gate region/structure G1 is offset from gate region/structure G0 in the positive X direction by pitch CPP, each of gate regions/structures G2 and G4 is offset from gate region/structure G1 in the positive X direction by pitch CPP, gate region/structure G3 is offset from gate region/structure G2 in the positive X direction by pitch CPP, gate region/structure G5 is offset from gate region/structure G4 in the positive X direction by pitch CPP, and dummy gate region/structure D2 is offset from each of gate regions/structures G3 and G5 in the positive X direction by pitch CPP.

Each of IC layout diagrams 100 and 200 includes a boundary PR, also referred to as a place-and-route boundary PR or prBoundary PR in some embodiments, corresponding to an enclosed region in an IC layout diagram usable for routing signal and power connections, e.g., as part of an automated place-and-route (APR) algorithm. Dummy gate regions D1 and D2 extend along the vertical portions of boundary PR.

Each of IC layout diagrams 100 and 200 also includes cut gate regions CG (single instances in FIGS. 1A and 2A labeled for clarity) that extend in the X direction. The locations at which cut gate regions CG intersect gate regions in IC layout diagram 100 correspond to isolation structures ISO (single instances in FIGS. 1A and 2A labeled for clarity) in the corresponding IC device 100.

Each of gate regions/structures G0 and G has two endpoints at instances of cut gate region CG that extend along the horizontal portions of boundary PR and correspond to two instances of isolation structure ISO. Gate regions/structures G2 and G4 have single endpoints at a same instance of cut gate region CG corresponding to a single instance of isolation structure ISO, and gate regions/structures G3 and G5 have single endpoints at a same instance of cut gate region CG corresponding to a single instance of isolation structure ISO.

Adjacent to each location at which a gate region/structure G0-G5 intersects/overlaps an active region/area A0-A3, the corresponding active region/area A0-A3 includes two instances of a source/drain (S/D) region/structure SD and an overlying metal-like defined (MD) region/segment MD (single instances in FIGS. 1A and 2A labeled collectively as SD/MD for clarity). As used herein, the terms S/D region(s)/structure(s) may refer to a source or a drain, individually or collectively dependent upon the context.

Each of IC devices/layout diagrams 100 and 200 includes frontside metal lines, also referred to as frontside metal regions/segments in some embodiments, that extend in the X direction in a first frontside metal layer and intersect/overlie respective active regions/areas A0-A3 and backside metal lines, also referred to as backside metal regions/segments in some embodiments, that extend in the X direction in a first backside metal layer and intersect/underlie respective active regions/areas A0-A3. A frontside or backside metal line is considered to overlie/underlie a given active area A0-A3 based on at least a portion of the frontside or backside metal line being aligned with at least a portion of the given active area in a Z direction (not shown in FIGS. 1A-2B) perpendicular to each of the X and Y directions.

As depicted in FIGS. 1A-2B, IC device/layout diagram 100 includes the frontside metal lines including bit lines BL0-BL3 and the backside metal lines including four instances of a source line VSS, and IC device/layout diagram 200 includes the frontside metal lines including four instances of source line VSS and the backside metal lines including bit lines BL0-BL3.

A source line, e.g., source line VSS, is a metal line electrically connected to a power supply reference node (not shown) of an IC circuit, e.g., a ROM circuit including ROM array 100 or 200, and thereby configured to receive a power supply reference voltage, e.g., VSS or ground.

A bit line, e.g., bit line BL0-BL3, is a metal line electrically connected to a signal source and/or selection circuit (not shown) of an IC circuit, e.g., a ROM circuit including ROM array 100 or 200, and thereby configured to receive one or more bias signals, e.g., a bias voltage, as part of a read operation of the ROM array.

In some embodiments, one or both of IC device/layout diagram 100 or 200 includes one or more additional metal lines or regions/segments (not shown), e.g., signal or power lines, that extend in the X direction in the first frontside and/or backside metal layer between corresponding instances of bit lines BL0-BL3 and/or source lines VSS.

Via regions/structures VG (single instances in FIGS. 1A and 2A labeled for clarity) intersect/overlie each of gate regions/structures G0, G1, G3, and G4. A metal region/segment WL0 intersects/overlies gate region/structure G0 and the corresponding via region/structure VG, a metal region/segment WL1 intersects/overlies gate region/structure G1 and the corresponding via region/structure VG, a metal region/segment WL2 intersects/overlies gate region/structure G4 and the corresponding via region/structure VG, and a metal region/segment WL3 intersects/overlies gate region/structure G3 and the corresponding via region/structure VG.

Each of metal regions/segments WL0, WL1, WL2, and WL3 and the corresponding via region/structure VG is a portion of a corresponding word line (labeled generically as word line WL) electrically connected to the corresponding gate region/structure G0, G1, G3, or G4. In some embodiments, metal regions/segments WL0-WL3 are referred to as word lines WL0-WL3.

A word line, e.g., word line WL0-WL3, is a metal line electrically connected to a signal source and/or selection circuit (not shown) of an IC circuit, e.g., a ROM circuit including ROM array 100 or 200, and thereby configured to receive one or more activation signals, e.g., an activation voltage, as part of a read operation of the ROM array.

In some embodiments, e.g., IC device/layout diagram 1200 or 1300 discussed below with respect to FIGS. 11-13B, gate region/structure G2 extends beyond IC device/layout 100 or 200 in the positive Y direction (not shown in FIGS. 1A-2B) and an instance of metal region/segment WL2 intersects/overlies the extended portion of gate region/structure G2 and corresponding via region/structure VG, and/or gate region/structure G5 extends beyond IC device/layout 100 or 200 in the negative Y direction (not shown in FIGS. 1A-2B) and an instance of metal region/segment WL3 intersects/overlies the extended portion of gate region/structure G5 and corresponding via region/structure VG.

An active region/area, e.g., active region/area A0-A3, is a region in an IC layout diagram included in a manufacturing process as part of defining an active area, also referred to as an oxide diffusion or definition (OD), in a semiconductor substrate, either directly or in an n-well or p-well region/area (not shown for the purpose of clarity), in which one or more IC device features, e.g., a S/D structure, is formed. In some embodiments, an active area is an n-type or p-type active area of a planar transistor, a FinFET, or a GAA transistor. In various embodiments, an active area (structure) includes one or more of a semiconductor material, e.g., silicon (Si), silicon-germanium (SiGe), silicon-carbide (SiC), or the like, a dopant material, e.g., boron (B), phosphorous (P), arsenic (As), gallium (Ga), or another suitable material.

In some embodiments, an active area is a region in an IC layout diagram included in the manufacturing process as part of defining a nano-sheet structure, e.g., a continuous volume of one or more layers of one or more semiconductor materials having either n-type or p-type doping. In various embodiments, individual nano-sheet layers include a single monolayer or multiple monolayers of a given semiconductor material.

In the embodiments discussed herein, each instance of active region/area A0-A3 is a same one of an n-type or p-type active region/area, e.g., a p-type active region/area corresponding to n-type ROM bits as discussed below.

A S/D region/structure, e.g., S/D region/structure SD, is a region in the IC layout diagram included in the manufacturing process as part of defining a S/D structure, also referred to as a semiconductor structure in some embodiments, configured to have a doping type opposite that of the corresponding active region/area. In some embodiments, a S/D region/structure is configured to have lower resistivity than an adjacent channel feature, e.g., a portion of the corresponding active region/area of a planar FET, a fin structure of a FinFET, or a gate structure of a GAA transistor. In some embodiments, a S/D region/structure includes one or more portions having doping concentrations greater than one or more doping concentrations present in the corresponding channel feature. In some embodiments, a S/D region/structure includes epitaxial regions of a semiconductor material, e.g., Si, SiGe, and/or silicon-carbide SiC.

An MD region/segment, e.g., MD region/segment MD, is a conductive region in the IC layout diagram included in the manufacturing process as part of defining an MD segment, also referred to as a conductive segment or MD conductive line or trace, in and/or on the semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., the first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more dopant materials having doping concentrations of about $1*10^{16}$ per cubic centimeter ($cm^{-3}$) or greater.

In some embodiments, a manufacturing process includes two MD layers, and an MD region/segment, e.g., MD region/segment MD, refers to both of the two MD layers in the manufacturing process.

A gate region/structure, e.g., a gate region/structure G0-G5, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A gate dielectric layer, e.g., a gate dielectric layer of a gate structure G0-G5, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

A cut gate region, e.g., a cut gate region CG, also referred to as a cut poly (CPO) region CG in some embodiments, is a region in the IC layout diagram included in the manufacturing process as part of defining a portion of a gate electrode that is removed and replaced with one or more dielectric materials in operations performed subsequent to the gate electrode formation, thereby electrically isolating the adjacent portions of the gate electrode from each other.

An isolation feature/structure, e.g., isolation feature/structure ISO, is a feature including one or more regions in the IC layout diagram included in the manufacturing process as part of defining an isolation structure configured to electrically isolate adjacent features from each other, e.g., adjacent gate electrode portions based on a cut gate region of the IC layout diagram. In some embodiments, an isolation feature/structure, e.g., isolation feature/structure ISO, includes a dielectric region/volume positioned between the adjacent features, e.g., gate regions/structures G2 and G4 or G3 and G5. A dielectric region is a region in the IC layout diagram included in the manufacturing process as part of defining a volume including one or more insulating materials.

In some embodiments, an isolation feature/structure includes a dielectric region corresponding to a dummy, e.g., electrically isolated, gate region/structure, e.g., dummy gate region/structure D1 or D2. In some embodiments, a dummy gate region/structure includes a gate region/structure electrically connected, e.g., tied-off, to one or more features, e.g., an adjacent instance of S/D region/structure SD, whereby a corresponding transistor is switched off. In some embodiments, a dummy gate region/structure that overlaps/overlies an edge of an active region/area, e.g., dummy gate region/structure D1 or D2, is referred to as a continuous poly on oxide definition edge (CPODE) region/structure.

A metal line or region, e.g., power supply line VSS or bit line BL, is a region in the IC layout diagram included in the manufacturing process as part of defining a metal line structure, or segment, including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process.

In some embodiments, a metal region/segment corresponds to a first frontside metal layer (also referred to as a metal zero layer M0 or frontside metal zero layer M0 in some embodiments), or a second or higher level frontside metal layer, e.g., metal layer M1 discussed below, of the manufacturing process.

In some embodiments, a metal region/segment corresponds to a first backside metal layer (also referred to as a backside metal zero layer BM0 in some embodiments), or a second or higher level backside metal layer, e.g., backside metal layer BM1 discussed below, of the manufacturing process.

A via region/structure, e.g., a via region/structure VG, or VD, VIA0, VB, or BVIA0 discussed below, is a region in the IC layout diagram included in the manufacturing process as part of defining a via structure including one or more conductive materials configured to provide an electrical connection between a first, e.g., overlying, conductive structure, e.g., a metal segment WL0-WL3 or a metal line VSS or BL, and a second, e.g., underlying, conductive structure, e.g., a gate electrode of a gate structure G0-G5, or an MD segment such as an instance of MD segment MD, or an S/D structure such as an instance of S/D structure SD, aligned with first conductive structure in the positive or negative Z direction.

In some embodiments, a via region/structure, e.g., via region/structure VB discussed below, corresponds to an electrical connection between the first conductive structure being a backside conductive structure, e.g., a backside metal region/segment in backside metal layer BM0, and the second conductive structure being a backside conductive structure or a frontside feature, e.g., an active area A0-A3.

Figure 3B:
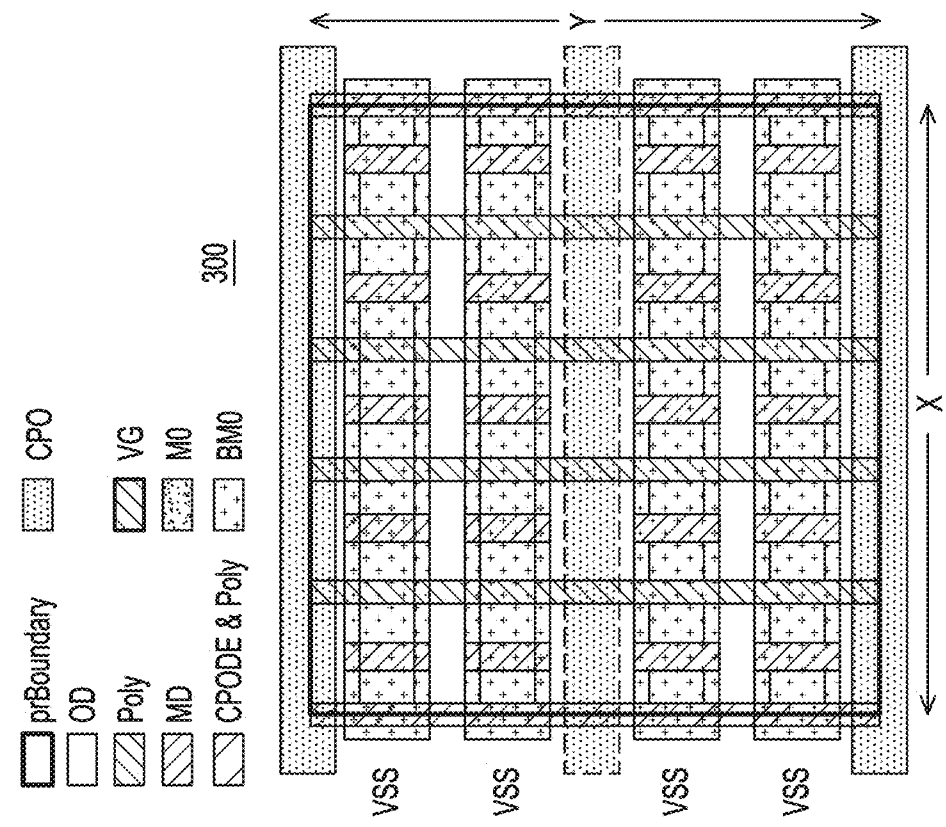
FIGS. 3A and 3B are plan views of front and back sides of an IC device and layout diagram, in accordance with some embodiments.
Figure 3A:
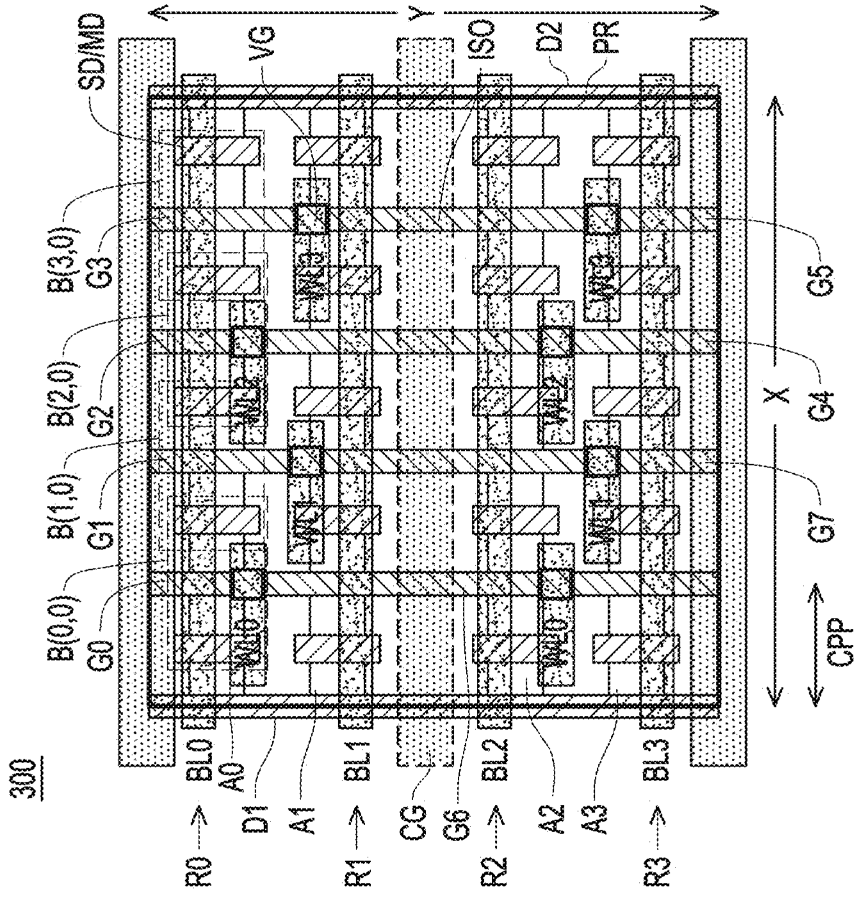
Figure 4B:
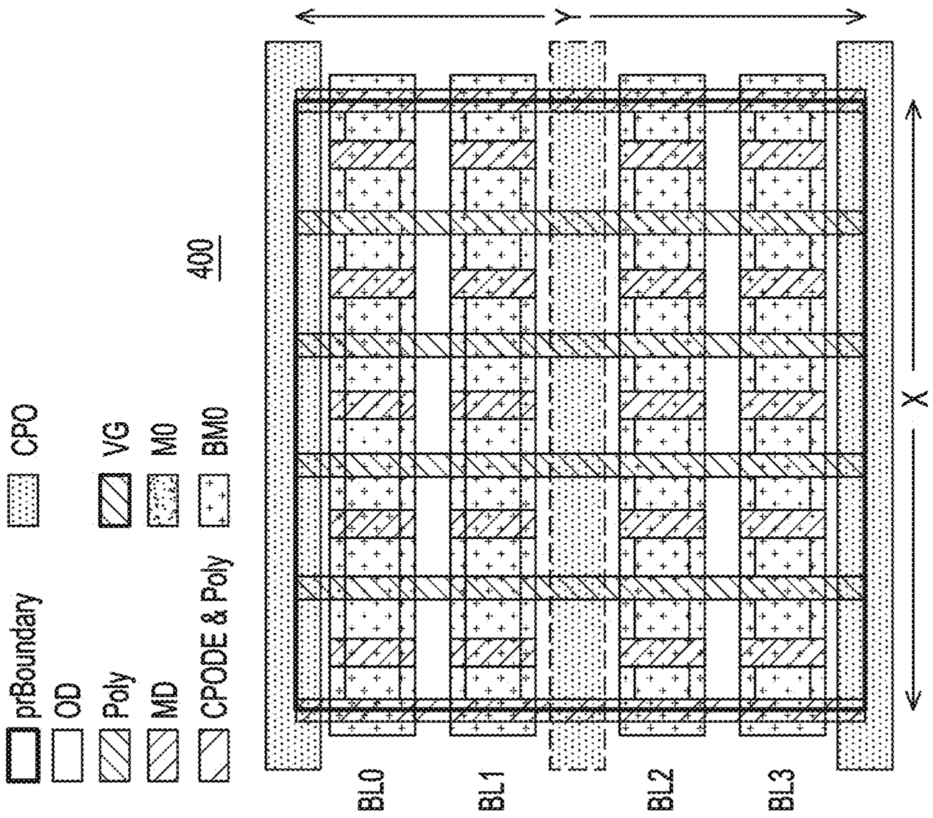
FIGS. 4A and 4B are plan views of front and back sides of an IC device and layout diagram, in accordance with some embodiments.
Figure 4A:
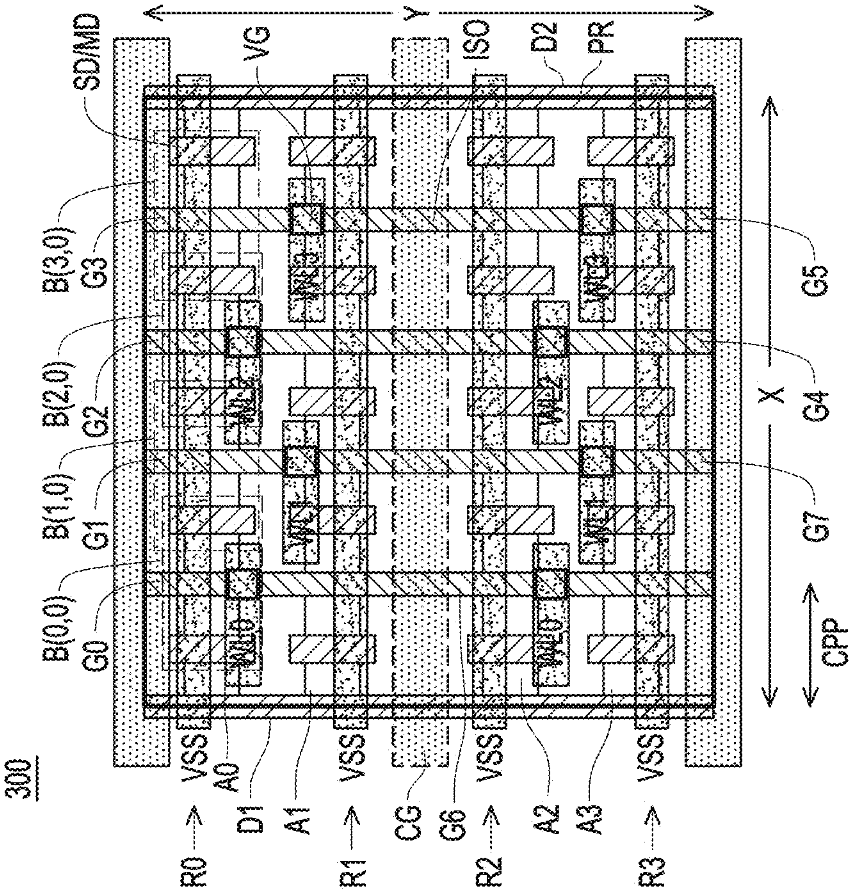

FIGS. 3A and 3B depict respective frontside and backside plan views of IC device/layout diagram 300, X and Y directions, and the key, and FIGS. 4A and 4B depict respective frontside and backside plan views of IC device/layout diagram 400, the X and Y directions, and the key, in accordance with some embodiments. IC devices/layout diagrams 300 and 400, also referred to as ROM arrays 300 and 400 in some embodiments, include most features in common with respective IC devices/layout diagrams 100 and 200 discussed above, with the exception of the arrangements of gate regions/structures G0-G7 and word lines WL0-WL3, as discussed below.

Each of IC devices/layout diagrams 300 and 400 includes active regions/areas A0-A3 and instances of S/D regions/structures and MD regions/segments arranged as discussed above with respect to FIGS. 1A-2B. IC device/layout diagram 300 includes the frontside and backside metal layers/segments including respective bit lines BL0-BL3 and source lines VSS as discussed above with respect to IC device/layout diagram 100 and FIGS. 1A and 1B, and IC device/layout diagram 400 includes the frontside and backside metal layers/segments including respective source lines VSS and bit lines BL0-BL3 as discussed above with respect to IC device/layout diagram 200 and FIGS. 2A and 2B.

Compared to IC devices/layout diagrams 100 and 200, each of IC devices/layout diagrams 300 and 400 includes three instances of cut gate regions CG that extend between dummy gate regions D1 and D2 such that each of gate regions/structures G0 and G1 intersects/overlaps each of active regions/areas A0 and A1 instead of active regions A0-A3, and each of gate regions/structures G6 and G7 intersects/overlaps active regions/areas A2 and A3.

Accordingly, each of gate regions/structures G0-G3 has a first endpoint at an instance of cut gate region CG that extends along the top horizontal portion of boundary PR and corresponds to four instances of isolation structure ISO, and each of gate regions/structures G4-G7 has a first endpoint at an instance of cut gate region CG that extends along the bottom horizontal portion of boundary PR and corresponds to four instances of isolation structure ISO.

In the embodiments depicted in FIGS. 3A-4B, each of gate regions/structures G0-G7 has a second endpoint at a third instance of cut gate region CG that extends between active regions/areas A1 and A2 and corresponds to four instances of isolation structure ISO. In some embodiments, IC layout diagram 300 and/or 400 does not include the third instance of cut gate region CG corresponding to the four instances of isolation structure ISO, and gate regions/structures G0-G3 are continuous with respective gate regions/structures G4-G7 such that corresponding gate electrodes overlap each of active areas A0-A3.

As depicted in FIGS. 3A-4B, IC devices/layout diagrams 300 and 400 include instances of metal region/segment WL0 that intersect/overlie each of gate regions/structures G0 and G6 and the corresponding via regions/structures VG, instances of metal region/segment WL1 that intersect/overlie gate regions/structures G1 and G7 and the corresponding via regions/structures VG, instances of metal region/segment WL2 that intersect/overlie gate regions/structures G2 and G4 and the corresponding via regions/structures VG, and instances of metal region/segment WL3 that intersect/overlie gate regions/structures G3 and G5 and the corresponding via regions/structures VG.

FIG. 5 depicts a portion of the elements of IC devices/layout diagrams 100-400 and the X and Z directions, in accordance with some embodiments. The elements depicted in FIG. 5 are not necessarily included in a same X-Z plane or aligned along the X direction as depicted, and are arranged as depicted solely for the purpose of illustration of relative locations of the elements of IC devices/layout diagrams 100-400 along the Z direction.

As depicted in FIG. 5, active region/area OD represents one of active regions/areas A0-A3. A gate region/structure PO positioned on active region/area OD represents one of gate region/structures G0-G7. A frontside via region/structure VG is positioned on the gate electrode of gate region/structure PO, and a first frontside metal region/segment M0 positioned in the first frontside metal layer and on the frontside via region/structure VG represents one of metal regions/segments WL0-WL3. A first frontside via region/structure VIA0 positioned on the first frontside metal region/segment M0 and a first frontside metal region/segment M1 positioned in the second frontside metal layer and on the first frontside via region/structure VIA0 represent further electrical connections of the word line corresponding to the one of metal regions/segments WL0-WL3.

An MD region/segment MD is positioned on active region/area OD, a frontside via region/structure VD is positioned on the MD region/segment MD, and a second frontside metal region/segment M0 positioned in the first frontside metal layer and on the frontside via region/structure VD represents one of bit lines BL0-BL3 or source lines VSS. A second frontside via region/structure VIA0 positioned on the second frontside metal region/segment M0 and a second frontside metal region/segment M1 positioned in the second frontside metal layer and on the second frontside via region/structure VIA0 represent further electrical connections to the one of bit lines BL0-BL3 or source line VSS.

A backside via region/structure VB is positioned on active region/area OD, and a backside metal region/segment BM0 positioned in the first backside metal layer and on the backside via region/structure VG represents one of bit lines BL0-BL3 or source lines VSS. A backside via region/structure BVIA0 positioned on the backside metal region/segment BM0 and a backside metal region/segment BM1 positioned in the second backside metal layer and on the back via region/structure BVIA0 represent further electrical connections to the one of bit lines BL0-BL3 or source line VSS.

By the configuration discussed above, each of IC devices/layout diagrams 100-400, includes an array of four rows R0-R3 of ROM bits B(0,0)-B(3,3), each row including a total of four ROM bits (a single row highlighted and labeled in FIGS. 1A-4A for clarity). Each ROM bit B(0,0)-B(3,3) (corresponding to B(word line number, row number)) includes an intersection/overlap of a gate region/structure G0-G5 (electrically connected to a corresponding word line WL, e.g., including metal region/segment WL0-WL3) and an active region/area A0-A3 along with adjacent active region/area portions including the two adjacent S/D regions/structures SD and overlying MD regions/segments MD.

A given ROM bit is considered to have a first logical state, e.g., a logic one, corresponding to a functional transistor by further including electrical connections between the two adjacent active region/area portions and each of the corresponding frontside or backside bit line BL0-BL3 and backside or frontside source line VSS, e.g., through a corresponding S/D region/structure SD, MD region/segment MD, and via region/structure VD to the frontside metal line or through a corresponding backside via region/structure VB to the backside metal line, as discussed below with respect to FIGS. 6-10B. A given ROM bit is considered to have a second logical state, e.g., a logic zero, corresponding to a non-functional transistor by further including a single or no electrical connection between the two adjacent active region/area portions and the corresponding bit line BL0-BL3 or source line VSS, or electrical connections between each of the adjacent active region/area portions and a single one of bit line BL0-BL3 or source line VSS.

In the embodiments depicted in FIGS. 1A-4B, each of IC devices/layout diagrams 100-400 is free from including an instance of frontside via region/structure VD or backside via region/structure VB, and each ROM bit B(0,0)-B(3,3) thereby has the second logical state corresponding to no electrical connection to the corresponding bit line BL0-BL3 or source line VSS. In some embodiments, e.g., the non-limiting examples of IC devices/layout diagrams 700-1000 discussed below with respect to FIGS. 6-10B, an IC device/layout diagram 100-400 includes one or more of ROM bits B(0,0)-B(3,3) having the first logical state corresponding to electrical connections, including via regions/structures VD and VB, to each of the corresponding bit line BL0-BL3 and source line VSS.

As depicted in each of FIGS. 1A-4B, the four ROM bits B(0,0)-B(3,0) of row R0 include a total of five S/D regions/structures SD corresponding to three of the S/D regions/structures SD being shared between adjacent ROM bits of the four ROM bits B(0,0)-B(3,0). ROM bits B(0,1)-B(3,1) of row R1, B(0,2)-B(3,2) of row R2, and B(0,3)-B(3,3) of row R3 (not labeled) are similarly configured.

Each of IC devices/layouts 100-400 is thereby configured to include an array of ROM bits B(0,0)-B(3,3) including each of rows R0-R3 including a total of four ROM bits positioned on four active areas A0-A3, first metal lines including one of bit lines BL0-BL3 or source lines VSS positioned above the active areas in a first frontside metal layer, and second metal lines including the other of bit lines BL0BL3 or source lines VSS positioned below the active areas in a first backside metal layer. Compared to other approaches, e.g., those in which both bit lines and source lines are positioned in a frontside metal layer, an IC device/layout diagram 100-400 is thereby capable of having a smaller overall area and increased bit line and source line widths and thereby lower resistance.

FIG. 6 is schematic diagram 600 of an IC and FIGS. 7A-10B are respective frontside and backside plan views of IC devices/layout diagrams 700-1000 corresponding to schematic diagram 600, in accordance with some embodiments.

IC devices/layout diagrams 700-1000 are non-limiting examples of respective IC devices/layout diagrams 100-400 including ROM bits having each of the first logical state corresponding to a logic one (logic one ROM bit) and the second logical state corresponding to a logic zero (logic zero ROM bit). In addition to the features depicted in FIGS. 1A-4B, FIGS. 7A-10A include instances of frontside via region/structure VD (a single one labeled for clarity), and FIGS. 7B-10B include instances of backside via region/structure VB (a single one labeled for clarity), as discussed below.

As depicted in FIG. 6, the four rows of ROM bits (corresponding to rows R0-R3) in schematic diagram 600 represent non-limiting examples of bytes including logic zero and logic one ROM bits so as to have values 0100, 0101, 0110, and 0111. IC schematic diagram 600 including other byte values, e.g., ranging from 0000-1111, are within the scope of the present disclosure.

As depicted in FIGS. 7A-10B, IC device/layout diagrams 700-1000 are usable as respective ones of IC device/layout diagrams 100-400, discussed above with respect to FIGS. 1A-5, with the addition of instances of via regions/structures VD and VB, as discussed below.

In the embodiments depicted in FIGS. 7A, 7B, 9A, and 9B, the corresponding IC device/layout diagram 700 or 900 includes each logic one ROM bit location including a frontside via region/structure VD positioned between one adjacent MD region/segment MD (and underlying S/D region/structure SD and active region/area A0-A3 portion) and corresponding overlying one of bit lines BL1-BL3, and a backside via region/structure VB positioned between the other adjacent active region/area A0-A3 portion and corresponding underlying source line VSS. Each logic zero ROM bit includes either zero via regions/structures VD or VB, a single frontside via region/structure VD corresponding to an active region/area A0-A3 portion shared with an adjacent logic one ROM bit, a single backside via region/structure VB corresponding to an active region/area A0-A3 portion shared with an adjacent logic one ROM bit, or in the case of location B(WL2,BL1), backside via regions/structures VB positioned between each of the adjacent active region/area A1 portions and the corresponding backside source line VSS.

In the embodiments depicted in FIGS. 8A, 8B, 10A, and 10B, the corresponding IC device/layout diagram 800 or 1000 includes each logic one ROM bit location including a frontside via region/structure VD positioned between one adjacent MD region/segment MD (and underlying S/D region/structure SD and active region/area A0-A3 portion) and corresponding overlying source line VSS, and a backside via region/structure VB positioned between the other adjacent active region/area A0-A3 portion and corresponding underlying one of bit lines BL0-BL3. Each logic zero ROM bit includes either zero via regions/structures VD or VB, a single frontside via region/structure VD corresponding to an active region/area A0-A3 portion shared with an adjacent logic one ROM bit, a single backside via region/structure VB corresponding to an active region/area A0-A3 portion shared with an adjacent logic one ROM bit, or in the case of location B(WL2,BL1), backside via regions/structures VB positioned between each of the adjacent active region/area A1 portions and bit line BL1.

FIGS. 6-10B thereby depict non-limiting examples of IC devices/layout diagrams 100-400 configured to include both logic one and logic zero ROM bits whereby byte values of 0000-1111 are capable of being programmed. Other configurations in which IC device/layout diagram 100 includes both logic one and logic zero ROM bits whereby byte values of 0000-1111 are capable of being programmed are within the scope of the present disclosure.

In some embodiments, multiple instances of IC devices/layout diagrams 100-400, e.g., including both logic one and logic zero ROM bits as discussed above, are positioned adjacent to each other along the X and/or Y directions, e.g., in one or more columns and one or more rows of IC devices/layout diagrams 100-400.

In such embodiments, each instance of IC device/layout diagram 100-400 includes electrical connections to each of word lines WL0-WL3. In some embodiments, the electrical connections are from each instance of a corresponding one of word lines WL0-WL3 to a common upper-level feature, e.g., an input/output (I/O) pad.

In some embodiments, instances of IC device/layout diagram 100 or 200 adjacent to each other along the Y direction include adjoining, thereby shared, gate regions/structures as discussed above with respect to FIGS. 1A-2B, e.g., gate regions G2 and G4 included in an instance word line WL2 or gate regions G3 and G5 included in an instance of word line WL3. The corresponding instances of gate regions/structures G2/G4 and G3/G5 included in word lines WL2 and WL3 thereby have lengths in the Y direction equal to those of instances of gate regions/structures G0 and G1 included in word lines WL0 and WL1.

The instances of gate regions/structures G2/G4 and G3/G5 included in word lines WL2 and WL3 thereby also have staggered positions in the Y direction with respect to the instances of gate regions/structures G0 and G1 included in word lines WL0 and WL1, with the instances of metal regions/segments WL1 and WL3 aligned with each other in the X direction and the instances of metal regions/segments WL0 and WL2 aligned with each other in the X direction.

Such embodiments are thereby configured to include the multiple instances of IC device/layout diagram 100 or 200 including gate regions/structures corresponding to single word line electrical connections having equal lengths, thereby having more uniform parasitic capacitance, resistance, and leakage properties than other approaches, e.g., in which gate regions/segments corresponding to single word line electrical connections have lengths that vary significantly.

FIG. 11 is schematic diagram 1100 of an IC and FIGS. 12A-13B are respective frontside and backside plan views of IC devices/layout diagrams 1200-1300 corresponding to schematic diagram 1100, in accordance with some embodiments.

IC devices/layout diagrams 1200 and 1300, also referred to as ROM arrays 1200 and 1300 in some embodiments, include respective IC devices/layout diagrams 100 and 200 and the X and Y directions, discussed above with respect to FIGS. 1A-8B, in which various features labeled in FIGS. 1A-2B are not labeled for the purpose of clarity.

Each of IC devices/layout diagrams 1200 and 1300 also includes a dummy array DA1 adjacent to IC device/layout diagram 100 or 200 in the positive Y direction and a dummy array DA2 adjacent to IC device/layout diagram 100 or 200 in the negative Y direction. Each of dummy arrays DA1 and DA2 includes two instances of active regions/areas corresponding to active regions/areas A0-A3 (not labeled for the purpose of clarity), two instances of metal regions/segments Dummy BL corresponding to bit lines BL0-BL3, and two instances of source lines VSS, each extending in the X direction between instances of dummy gate regions/structures D1 and D2 (not labeled for the purpose of clarity) as discussed above with respect to FIGS. 1A-10B.

Figure 12B:
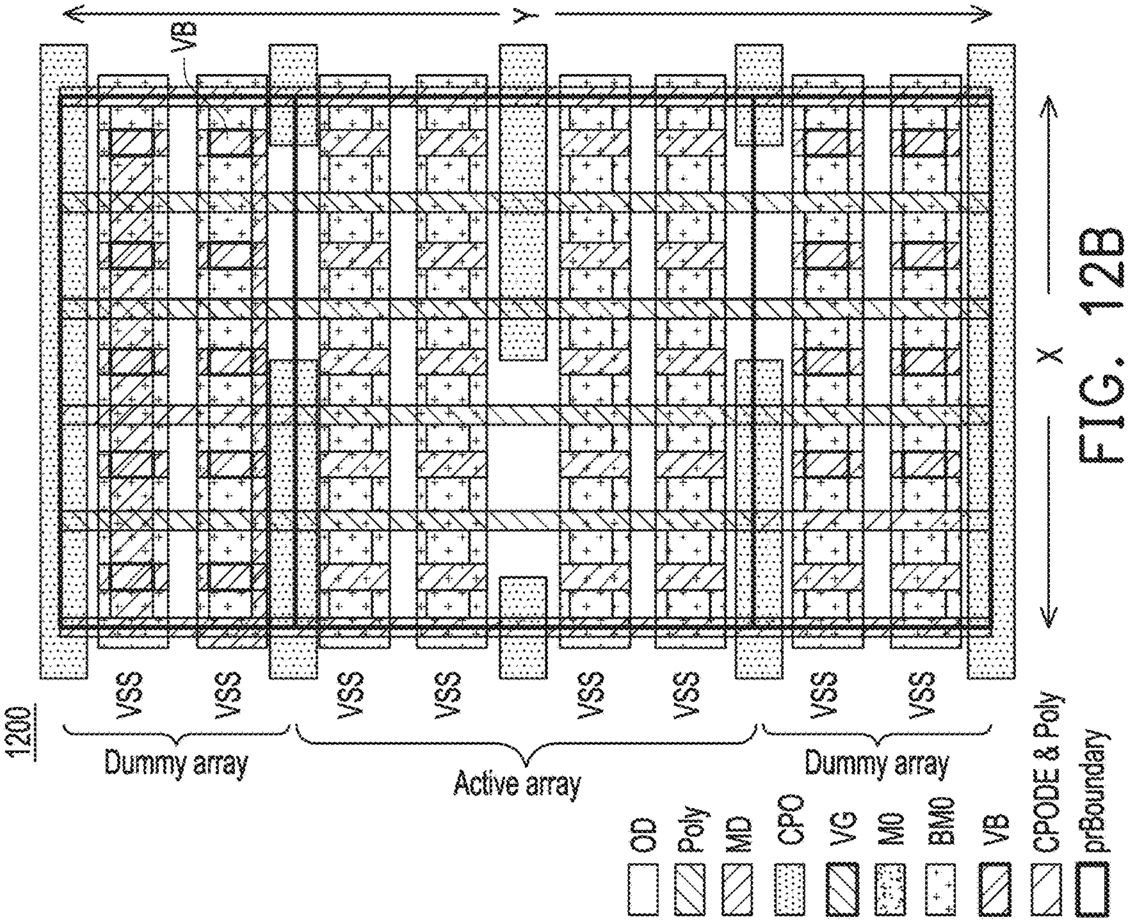
FIGS. 12A and 12B are plan views of front and back sides of an IC device and layout diagram, in accordance with some embodiments.
Figure 12A:
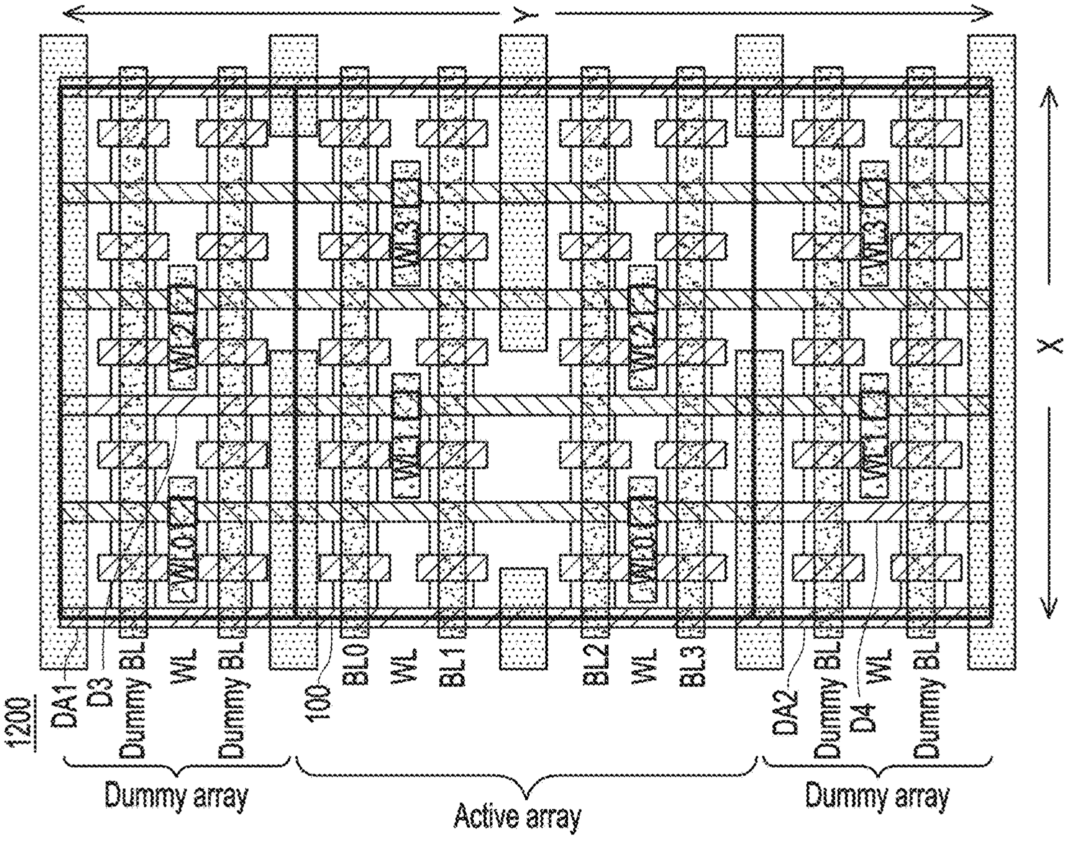
Figure 13B:
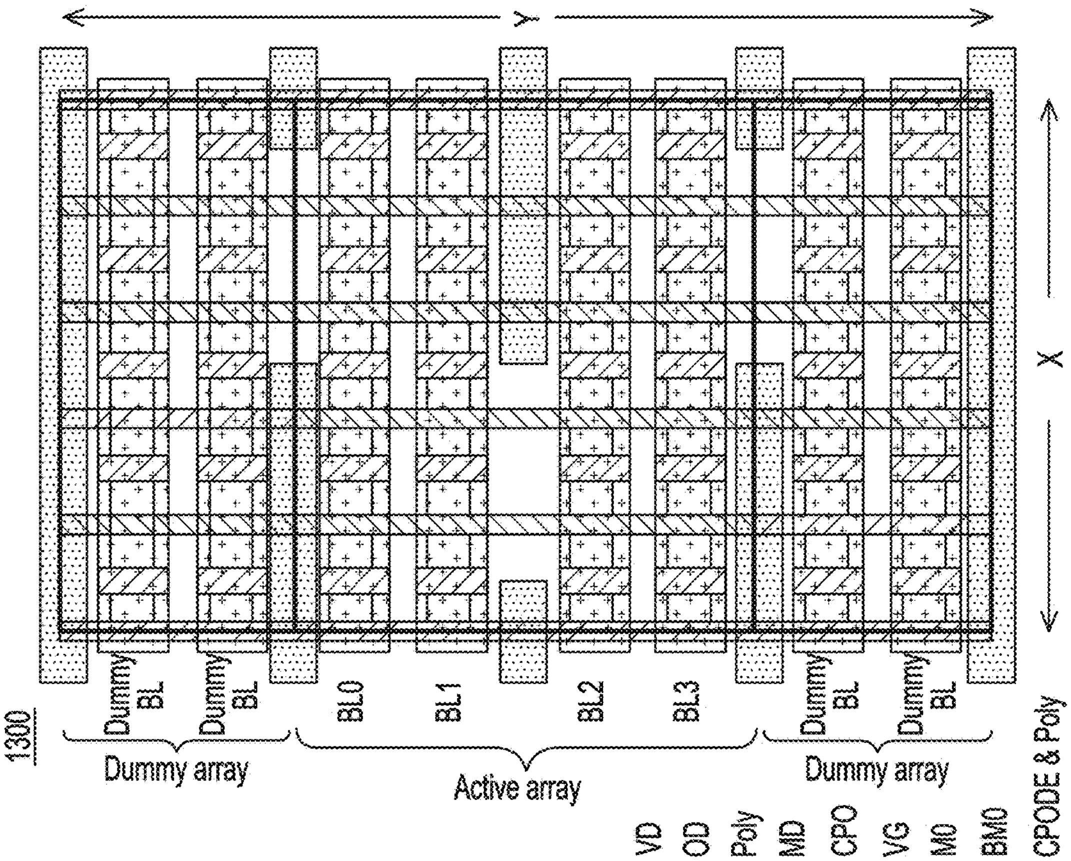
FIGS. 13A and 13B are plan views of front and back sides of an IC device and layout diagram, in accordance with some embodiments.
Figure 13A:
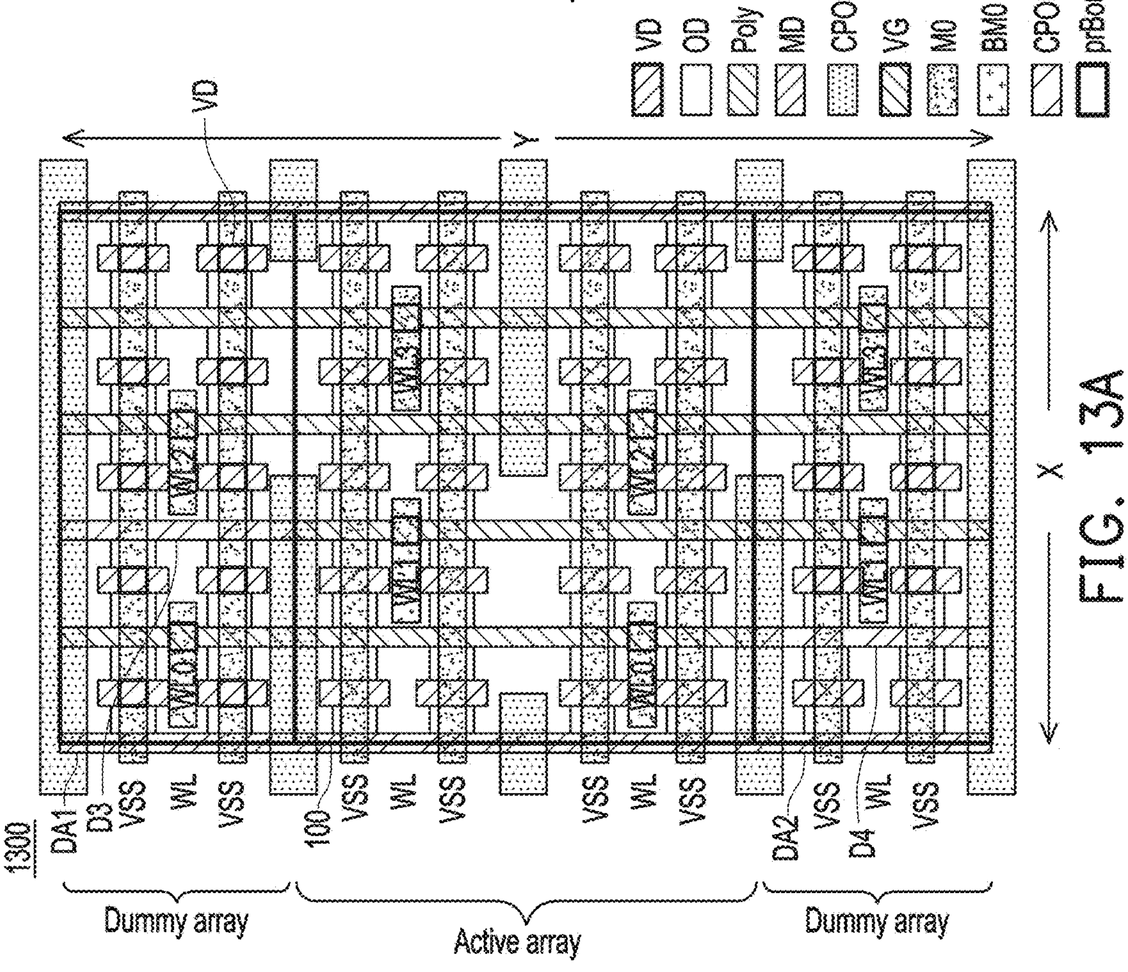

As depicted in FIGS. 12A and 12B, IC device/layout diagram 1200 includes frontside metal regions/segments including instances of Dummy BL and backside regions/segments including instances of source line VSS. As depicted in FIGS. 13A and 13B, IC device/layout diagram 1300 includes frontside metal regions/segments including instances of source line VSS and backside regions/segments including instances of Dummy BL.

Dummy array DA1 further includes an instance of gate region/structure G0 (not labeled for the purpose of clarity) and corresponding metal region/segment WL0, a dummy gate region/structure D3, an extension of gate region/structure G2 and corresponding metal region/segment WL2, and an extension of gate region/structure G3. As depicted in FIGS. 12A and 12B, dummy array DA1 of IC device/layout diagram 1200 includes electrical connections corresponding to schematic diagram 1100 (through instances of backside via regions/structures VB, a single one labeled for clarity) between each of the active region/area portions adjacent to each of gate regions/structures G0, G2, and G3 and the corresponding underlying source line VSS. As depicted in FIGS. 13A and 13B, dummy array DA1 of IC device/layout diagram 1300 includes electrical connections corresponding to schematic diagram 1100 (through instances of frontside via region/structure VD, a single one labeled for clarity) between each of the active region/area portions adjacent to each of gate regions/structures G0, G2, and G3 and the corresponding overlying source line VSS.

Dummy array DA2 further includes a dummy gate region/structure D4, an instance of gate region/structure G1 (not labeled for the purpose of clarity) and corresponding metal region/segment WL1, an extension of gate region/structure G4, and an extension of gate region/structure G5 and corresponding metal region/segment WL3. As depicted in FIGS. 12A and 12B, dummy array DA2 includes electrical connections corresponding to schematic diagram 1100 (through instances of frontside via regions/structures VD, a single one labeled for clarity) between each of the active region/area portions adjacent to each of gate regions/structures G1, G4, and G5 and the corresponding overlying source line VSS. As depicted in FIGS. 13A and 13B, dummy array DA2 includes electrical connections corresponding to schematic diagram 1100 (through instances of frontside via regions/structures VD, a single one labeled for clarity) between each of the active region/area portions adjacent to each of gate regions/structures G1, G4, and G5 and the corresponding overlying source line VSS In the embodiments depicted in FIGS. 12A-13B, each of IC devices/layout diagrams 1200 and 1300 includes single instances of each of the corresponding IC device/layout diagram 100 or 200 (including all logic zero ROM bits) and dummy arrays DA1 and DA2 for the purpose of illustration. In some embodiments, IC device/layout diagram 1200 and/or 1300 includes more than one instance of one or more of the corresponding IC device/layout diagram 100 or 200 and/or dummy arrays DA1 and/or DA2. In some embodiments, IC device/layout diagram 1200 or 1300 includes the one or more instances of corresponding IC device/layout diagram 100 or 200 including one or more logic one ROM bits in addition to or instead of the logic zero ROM bits, e.g., as discussed above with respect to FIGS. 6-10B.

By including one or more instances of dummy arrays DA1 and/or DA2, IC each of devices/layout diagrams 1200 and 1300 includes gate regions/structures corresponding to single word line electrical connections having equal lengths and terminations based on source line connections, thereby enabling the uniform parasitic capacitance, resistance, and leakage properties discussed above.

FIG. 14 is a flowchart of method 1400 of manufacturing an IC device, in accordance with some embodiments. Method 1400 is operable to form some or all of one or more of IC devices 100-400, 700-1000, 1200, or 1300 discussed above with respect to FIGS. 1A-13B.

In some embodiments, performing some or all of the operations of method 1400 is part of building a plurality of IC devices, e.g., transistors, logic gates, memory cells, interconnect structures, and/or other suitable devices, by performing a plurality of manufacturing operations, e.g., one or more of a lithography, diffusion, deposition, etching, planarizing, or other operation suitable for building the plurality of IC devices in a semiconductor wafer.

In some embodiments, the operations of method 1400 are performed in the order depicted in FIG. 14. In some embodiments, the operations of method 1400 are performed in an order other than the order depicted in FIG. 14. In some embodiments, one or more additional operations are performed before, during, and/or after the operations of method 1400. In some embodiments, performing some or all of the operations of method 1400 includes performing one or more operations as discussed below with respect to IC manufacturing system 1700 and FIG. 17.

At operation 1402, first through fourth active areas are formed in a semiconductor substrate. In some embodiments, forming the first through fourth active areas includes forming active areas A0-A3 discussed above with respect to FIGS. 1A-13B.

Forming the first through fourth active areas includes forming the first through fourth active areas having a length in a first direction equal to five times a gate pitch, e.g., having the length in the X direction equal to five times gate pitch CPP discussed above with respect to FIGS. 1A-13B.

In some embodiments, forming the first through fourth active areas includes performing one or more deposition and/or implantation processes in areas of a semiconductor substrate corresponding to the one or more instances of IC 100-400, 700-1000, 1200, or 1300. In some embodiments, forming the first through fourth active areas includes forming S/D structures and/or MD segments, e.g., S/D structures SD and/or MD segments MD discussed above with respect to FIGS. 1A-13B.

In some embodiments, forming the first through fourth active areas includes forming active areas in addition to the first through fourth active areas, e.g., fifth through eighth active areas aligned with the first through fourth active areas in the X or Y direction as discussed above, or configured in accordance with dummy array DA1 and/or DA2 as discussed above with respect to FIGS. 11-13B.

At operation 1404, a plurality of gate structures is constructed on the first through fourth active areas. Constructing the plurality of gate structures includes constructing first and second dummy gate structures separated by five times a gate pitch and positioned over endpoints of the first through fourth active areas, and constructing a plurality of gate electrodes between the first and second dummy gate structures and positioned over the first through fourth active areas. In some embodiments, constructing the plurality of gate structures includes constructing dummy gate structures D1 and D2 discussed above with respect to FIGS. 1A-13B.

In some embodiments, constructing the first and second dummy gate structures includes constructing one or more dummy gate structures in addition to the first and second dummy gate structures, e.g., as discussed above with respect to FIGS. 11-13B.

In some embodiments, constructing the plurality of gate electrodes includes constructing the gate electrodes as part of constructing gate structures G0-G5 or G0-G7 positioned over active areas A0-A3 as discussed above with respect to FIGS. 1A-13B. In some embodiments, constructing the plurality of gate electrodes includes forming isolation structures adjacent to each of the gate electrodes, e.g., instances of isolation structure ISO discussed above with respect to FIGS. 1A-13B.

In some embodiments, constructing the plurality of gate structures includes constructing one or more gate structures in addition to those positioned over the first through fourth active areas, e.g., as discussed above with respect to FIGS. 11-13B.

In some embodiments, constructing the plurality of gate structures includes performing a plurality of manufacturing operations, e.g., one or more of a lithography, diffusion, deposition, etching, planarizing, or other operation suitable for constructing the plurality of gate structures as discussed above with respect to FIGS. 1A-13B.

At operation 1406, electrical connections from a first active area portion adjacent to one of the gate electrodes to one of a frontside bit line or source line of a ROM circuit are formed. In some embodiments, forming the electrical connections from the first active area portion adjacent to the gate electrode to one of the frontside bit line or source line includes forming a frontside via structure VD over instances of MD structure MD and S/D structure SD and a portion of an active area A0-A3 to one or more of overlying frontside bit lines BL0-BL3 or source lines VSS as discussed above with respect to FIGS. 1A-13B.

In some embodiments, forming the electrical connections from the first active area portion includes forming the electrical connections based on a ROM bit programming pattern.

In some embodiments, forming electrical connections, e.g., by performing one or more of operations 1406-1410, includes forming one or more via structures and/or metal segments by performing a plurality of manufacturing operations including depositing and patterning one or more photoresist layers, performing one or more etching processes, and performing one or more deposition processes whereby one or more conductive materials are configured to form a continuous, low resistance structure.

At operation 1408, in some embodiments, electrical connections from the plurality of gate electrodes to first through fourth word lines of the ROM circuit are formed. In some embodiments, forming the electrical connections includes forming metal segments WL0-WL3 of word lines WL0-WL3 discussed above with respect to FIGS. 1A-13B.

In some embodiments, forming the electrical connections from the plurality of gate electrodes to first through fourth word lines of the ROM circuit includes forming electrical connections from one or more frontside bit lines, e.g., bit lines BL0-BL3 discussed above with respect to FIGS. 1A-13B, to one or more signal source and/or selection circuits of the ROM circuit or from one or more frontside source lines, e.g., source lines VSS discussed above with respect to FIGS. 1A-13B, to one or more power supply reference voltage nodes.

At operation 1410, electrical connections from a second active area portion adjacent to one of the gate electrodes to one of a backside bit line or source line of the ROM circuit are formed. In some embodiments, forming the electrical connections from the second active area portion adjacent to the gate electrode to one of the backside bit line or source line includes forming a backside via structure VB on a portion of an active area A0-A3 to one or more of underlying backside bit lines BL0-BL3 or source lines VSS as discussed above with respect to FIGS. 1A-13B.

In some embodiments, forming the electrical connections from the second active area portion adjacent to one of the gate electrodes to one of the backside bit line or source line of the ROM circuit includes forming electrical connections from one or more backside bit lines, e.g., bit lines BL0-BL3 discussed above with respect to FIGS. 1A-13B, to one or more signal source and/or selection circuits of the ROM circuit or from one or more backside source lines, e.g., source lines VSS discussed above with respect to FIGS. 1A-13B, to one or more power supply reference voltage nodes.

In some embodiments, forming the electrical connections from the second active area region includes forming the electrical connections based on a ROM bit programming pattern.

By performing some or all of the operations of method 1400, an IC device is manufactured in which an array of ROM bits includes each of four rows including a total of four ROM bits, first metal lines including one of bit lines or source lines positioned above the active areas in a first frontside metal layer, and second metal lines including the other of the bit lines or source lines positioned below the active areas in a first backside metal layer, thereby enabling the realization of the benefits discussed above with respect to IC devices 100-400, 700-100, 1200, and 1300.

FIG. 15 is a flowchart of method 1500 of generating an IC layout diagram, e.g., one or more of IC layout diagrams 100-400, 700-1000, 1200, or 1300 discussed above with respect to FIGS. 1A-13B, in accordance with some embodiments.

In some embodiments, generating the IC layout diagram includes generating the IC layout diagram corresponding to an IC device, e.g., IC device 100-400, 700-1000, 1200, or 1300 discussed above with respect to FIGS. 1A-13B, manufactured based on the generated IC layout diagram.

In some embodiments, some or all of method 1500 is executed by a processor of a computer, e.g., a processor 1602 of an IC layout diagram generation system 1600, discussed below with respect to FIG. 16.

Some or all of the operations of method 1500 are capable of being performed as part of a design procedure performed in a design house, e.g., a design house 1720 discussed below with respect to FIG. 17.

In some embodiments, the operations of method 1500 are performed in the order depicted in FIG. 15. In some embodiments, the operations of method 1500 are performed simultaneously and/or in an order other than the order depicted in FIG. 15. In some embodiments, one or more operations are performed before, between, during, and/or after performing one or more operations of method 1500.

At operation 1502, first through fourth active regions are arranged between dummy gate regions in an IC layout diagram of a ROM circuit, the dummy gate regions being separated by five times a gate pitch. In some embodiments, arranging the first through fourth active regions between the dummy gate regions includes arranging active regions A0-A3 between dummy gate regions D1 and D2 separated by five times pitch CPP as discussed above with respect to FIGS. 1A-13B.

In some embodiments, arranging the first through fourth adjacent active regions includes arranging active regions in addition to the first through fourth adjacent active regions, e.g., as discussed above with respect to FIGS. 1A-13B.

At operation 1504, first through fourth gate regions are arranged between the dummy gate regions and intersecting the first through fourth active areas. In some embodiments, arranging the first through fourth gate regions includes arranging gate regions G0-G5 or G0-G7 between dummy gate regions D1 and D2 and intersecting active areas A0-A3 as discussed above with respect to FIGS. 1A-13B.

In some embodiments, arranging the first through fourth gate regions includes intersecting the first through fourth gate regions with cut gate regions, e.g., cut gate regions CG discussed above with respect to FIGS. 1A-13B.

In some embodiments, arranging the first through fourth gate regions includes arranging gate regions in addition to the first through fourth gate regions, e.g., as discussed above with respect to FIGS. 1A-13B.

At operation 1506, in some embodiments, electrical connections from four of the gate regions to first through fourth word lines of a ROM circuit are configured in the IC layout diagram. In some embodiments, configuring the electrical connections from the four of the gate regions to the first through fourth word lines includes configuring metal regions WL0-WL4 and instances of via region VG as discussed above with respect to FIGS. 1A-13B.

In some embodiments, configuring the electrical connections from the four of the gate regions to the first through fourth word lines includes configuring electrical connections from one or more gate regions in addition to the four gate regions to the first through fourth word lines, e.g., as discussed above with respect to FIGS. 1A-13B.

At operation 1508, electrical connections from first and second active area regions adjacent to one or more of the gate regions to frontside and backside bit lines and source lines of the ROM circuit are configured in the IC layout diagram. In some embodiments, configuring the electrical connections from the first and second active area regions adjacent to one or more of the gate regions to the frontside and backside bit lines and source lines of the ROM circuit includes configuring one or more instances of frontside via region VD, MD regions MD, S/D regions S/D, and/or regions of active regions A0-A3 to one or more of frontside bit lines BL0-BL3 or source lines VSS, and configuring one or more instances of backside via region VB and/or regions of active regions A0-A3 to one or more of backside source lines VSS or frontside bit lines BL0-BL3, as discussed above with respect to FIGS. 1A-13B.

In some embodiments, configuring the electrical connections from first and second active area regions adjacent to one or more of the gate regions to frontside and backside bit lines and source lines of the ROM circuit includes configuring electrical connections from one or more active area regions in addition to the first and second active area regions to the frontside and backside bit lines and source lines of the ROM circuit, e.g., as discussed above with respect to FIGS. 1A-13B.

In some embodiments, configuring the electrical connections from the first and second active area regions adjacent to one or more of the gate regions to the frontside and backside bit lines and source lines of the ROM circuit includes performing a ROM programming operation.

At operation 1510, in some embodiments, the IC layout diagram including the first through fourth adjacent active regions and first through fourth gate regions is stored in a storage device. In some embodiments, storing the IC layout diagram in the storage device includes storing one or more of IC layout diagrams 100-400, 700-1000, 1200, or 1300, discussed above with respect to FIGS. 1A-13B, in the storage device.

In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in cell library 1607, in layout diagrams 1609, or over network 1614 of IC layout diagram generation system 1600, discussed below with respect to FIG. 16.

At operation 1512, in some embodiments, one or more manufacturing operations, one or more lithographic exposures, are performed based on the IC layout diagram. Non-limiting examples of performing one or more manufacturing operations, e.g., one or more lithographic exposures, based on the IC layout diagram are discussed above with respect to FIG. 14 and below with respect to FIG. 17.

By executing some or all of the operations of method 1500, an IC layout diagram is generated corresponding to an IC device in which an array of ROM bits includes each of four rows including a total of four ROM bits, first metal lines including one of bit lines or source lines positioned above the active areas in a first frontside metal layer, and second metal lines including the other of the bit lines or source lines positioned below the active areas in a first backside metal layer, thereby enabling the realization of the benefits discussed above with respect to IC devices 100-400, 700-100, 1200, and 1300.

Figure 16:
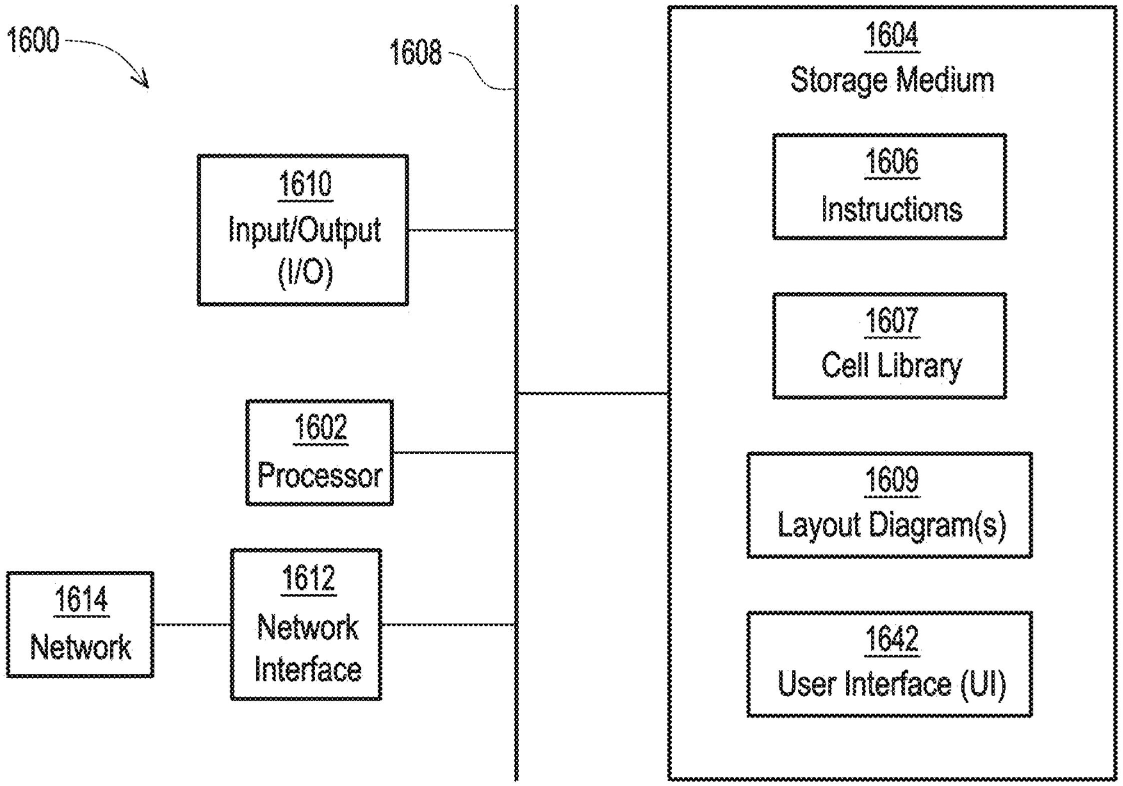
FIG. 16 is a block diagram of an IC layout diagram generation system, in accordance with some embodiments.

FIG. 16 is a block diagram of IC layout diagram generation system 1600, in accordance with some embodiments. Methods described herein of designing IC layout diagrams in accordance with one or more embodiments are implementable, for example, using IC layout diagram generation system 1600, in accordance with some embodiments.

In some embodiments, IC layout diagram generation system 1600 is a general purpose computing device including a hardware processor 1602 and a non-transitory, computer-readable storage medium 1604. Storage medium 1604, amongst other things, is encoded with, i.e., stores, computer program code 1606, i.e., a set of executable instructions. Execution of instructions 1606 by hardware processor 1602 represents (at least in part) an electronic design automation (EDA) tool which implements a portion or all of a method, e.g., method 1500 of generating an IC layout diagram described above with respect to FIG. 15 (hereinafter, the noted processes and/or methods).

Processor 1602 is electrically coupled to computer-readable storage medium 1604 via a bus 1608. Processor 1602 is also electrically coupled to an I/O interface 1610 by bus 1608. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute computer program code 1606 encoded in computer-readable storage medium 1604 in order to cause IC layout diagram generation system 1600 to be usable for performing a portion or all of the noted processes and/or methods. In one or more embodiments, processor 1602 is a central processing unit (CPU), a multiprocessor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, computer-readable storage medium 1604 stores computer program code 1606 configured to cause IC layout diagram generation system 1600 (where such execution represents (at least in part) the EDA tool) to be usable for performing a portion or all of the noted processes and/or methods. In one or more embodiments, computer-readable storage medium 1604 also stores information which facilitates performing a portion or all of the noted processes and/or methods.

In one or more embodiments, computer-readable storage medium 1604 stores cell library 1607 of cells including such cells as disclosed herein, e.g., IC layout diagrams 100-400, 700-100, 1200, and/or 1300 discussed above with respect to FIGS. 1A-13B.

In one or more embodiments, computer-readable storage medium 1604 stores layout diagrams 1609 including such IC layout diagrams as disclosed herein, e.g., IC layout diagrams 100-400, 700-100, 1200, and/or 1300 discussed above with respect to FIGS. 1A-13B.

IC layout diagram generation system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

IC layout diagram generation system 1600 also includes network interface 1612 coupled to processor 1602. Network interface 1612 allows system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 1600.

IC layout diagram generation system 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. IC layout diagram generation system 1600 is configured to receive information related to a UI through I/O interface 1610. The information is stored in computer-readable medium 1604 as user interface (UI) 1642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 1600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 17:
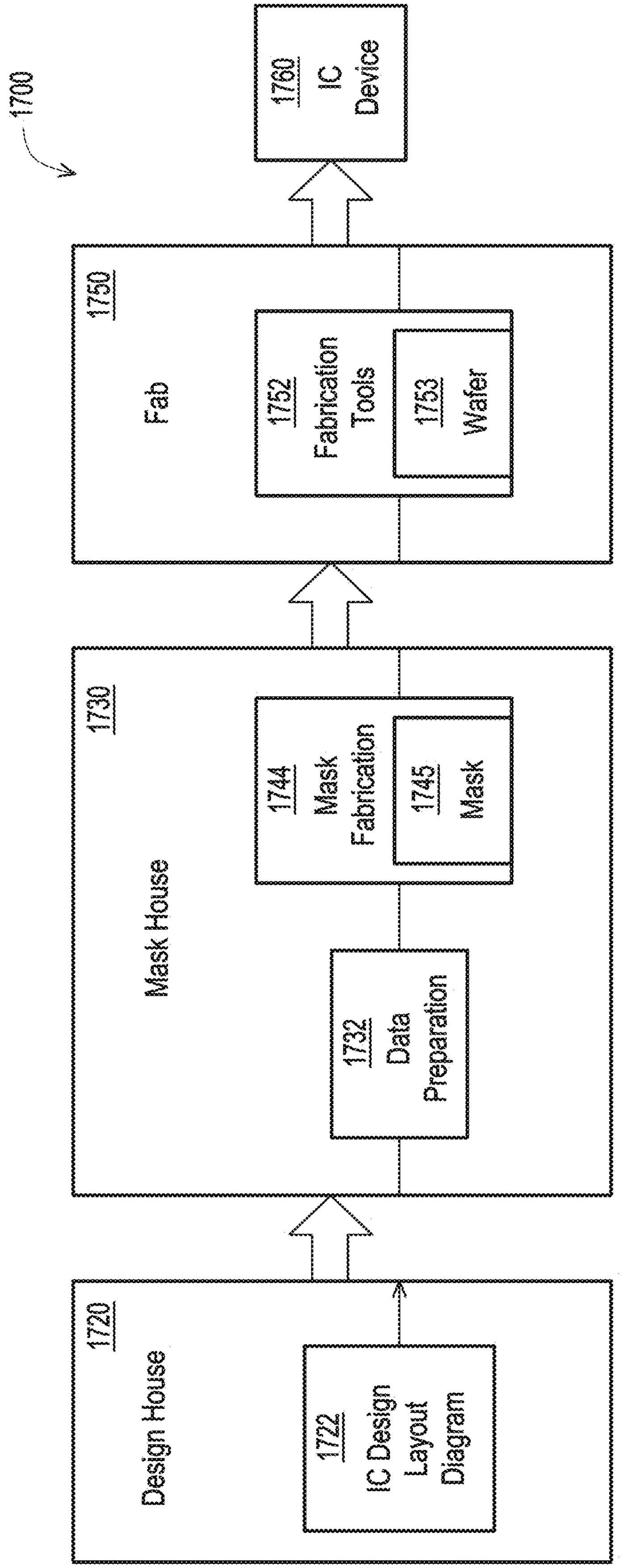
FIG. 17 is a block diagram of an IC manufacturing system, and an IC manufacturing flow associated therewith, in accordance with some embodiments.

FIG. 17 is a block diagram of IC manufacturing system 1700, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760. The entities in system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single larger company. In some embodiments, two or more of design house 1720, mask house 1730, and IC fab 1750 coexist in a common facility and use common resources.

Design house (or design team) 1720 generates an IC design layout diagram 1722. IC design layout diagram 1722 includes various geometrical patterns, e.g., one or more of IC layout diagrams 100-400, 700-100, 1200, or 1300 discussed above with respect to FIGS. 1A-13B. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to form IC design layout diagram 1722. The design procedure includes one or more of logic design, physical design or place and route. IC design layout diagram 1722 is presented in one or more data files having information of the geometrical patterns. For example, IC design layout diagram 1722 can be expressed in a GDSII file format or DFII file format.

Mask house 1730 includes data preparation 1732 and mask fabrication 1744. Mask house 1730 uses IC design layout diagram 1722 to manufacture one or more masks 1745 to be used for fabricating the various layers of IC device 1760 according to IC design layout diagram 1722. Mask house 1730 performs mask data preparation 1732, where IC design layout diagram 1722 is translated into a representative data file (RDF). Mask data preparation 1732 provides the RDF to mask fabrication 1744. Mask fabrication 1744 includes a mask writer. A mask writer converts the RDF to an image on a substrate, such as a mask (reticle) 1745 or a semiconductor wafer 1753. The design layout diagram 1722 is manipulated by mask data preparation 1732 to comply with particular characteristics of the mask writer and/or requirements of IC fab 1750. In FIG. 17, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout diagram 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout diagram 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1722.

It should be understood that the above description of mask data preparation 1732 has been simplified for the purposes of clarity. In some embodiments, data preparation 1732 includes additional features such as a logic operation (LOP) to modify the IC design layout diagram 1722 according to manufacturing rules. Additionally, the processes applied to IC design layout diagram 1722 during data preparation 1732 may be executed in a variety of different orders.

After mask data preparation 1732 and during mask fabrication 1744, a mask 1745 or a group of masks 1745 are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask (photomask or reticle) 1745 based on the modified IC design layout diagram 1722. Mask 1745 can be formed in various technologies. In some embodiments, mask 1745 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

IC fab 1750 is an IC fabrication business that includes one or more manufacturing facilities for the fabrication of a variety of different IC products. In some embodiments, IC Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 includes wafer fabrication tools 1752 configured to execute various manufacturing operations on semiconductor wafer 1753 such that IC device 1760 is fabricated in accordance with the mask(s), e.g., mask 1745. In various embodiments, fabrication tools 1752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to form IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, multilevel interconnects, and the like (formed at subsequent manufacturing steps).

In some embodiments, a ROM array includes first through fourth rows of four ROM bits positioned along respective first through fourth active areas in a front side of a semiconductor substrate, first through fourth metal lines aligned with the first through fourth active areas in a first direction and positioned in a first frontside metal layer of the semiconductor substrate, and fifth through eighth metal lines aligned with the first through fourth active areas in the first direction and positioned in a first backside metal layer of the semiconductor substrate, wherein the first through fourth metal lines include one of bit lines or source lines of the ROM array, and the fifth through eighth metal lines include the other of the bit lines or the source lines of the ROM array. In some embodiments, each ROM bit of the four ROM bits of each row of ROM bits comprises a gate structure and two S/D structures adjacent to the gate structure in the corresponding active area, and three of the S/D structures of each row of ROM bits are shared by the four ROM bits. In some embodiments, each of the first through fourth active areas extends between first and second dummy gate structures, the first and second dummy gate structures and gate structures of each ROM bit of the four ROM bits of each row of ROM bits are spaced apart in accordance with a gate pitch, and the first and second dummy gate structures are separated by a distance corresponding to five times the gate pitch. In some embodiments, at least one ROM bit of the four ROM bits of each row of ROM bits includes a frontside via structure positioned between one of the two S/D structures and a corresponding one of the first through fourth metal lines and a backside via structure positioned between the other of the two S/D structures and a corresponding one of the fifth through eighth metal lines. In some embodiments, the ROM array includes a first gate electrode shared by the first ROM bit of each of the first through fourth rows of ROM bits, a second gate electrode shared by the second ROM bit of each of the first through fourth rows of ROM bits, a third gate electrode shared by the third ROM bit of each of the first and second rows of ROM bits, a fourth gate electrode shared by the fourth ROM bit of each of the first and second rows of ROM bits, a fifth gate electrode shared by the third ROM bit of each of the third and fourth rows of ROM bits, and a sixth gate electrode shared by the fourth ROM bit of each of the third and fourth rows of ROM bits. In some embodiments, the ROM array includes fifth through eighth rows of ROM bits including respective fifth through eighth active areas, wherein the fifth active area is adjacent to the fourth active area, each of the fifth through eighth rows of ROM bits includes four ROM bits positioned along the corresponding one of the fifth through eighth active areas, the fifth gate electrode is further shared by the third ROM bit of each of the fifth and sixth rows of ROM bits, and the sixth gate electrode is further shared by the fourth ROM bit of each of the fifth and sixth rows of ROM bits, a seventh gate electrode shared by the first ROM bit of each of the fifth through eighth rows of ROM bits, an eighth gate electrode shared by the second ROM bit of each of the fifth through eighth rows of ROM bits, a ninth gate electrode shared by the third ROM bit of each of the seventh and eighth rows of ROM bits, a tenth gate electrode shared by the fourth ROM bit of each of the seventh and eighth rows of ROM bits, ninth through twelfth metal lines aligned with the fifth through eighth active areas in the first direction and including the one of the bit lines or the source lines positioned in the first frontside metal layer, and thirteenth through sixteenth metal lines aligned with the fifth through eighth active areas in the first direction and including the other of the bit lines or the source lines positioned in the first backside metal layer. In some embodiments, the ROM array includes first and second rows of dummy ROM bits including respective fifth and sixth active areas, wherein the fifth active area is adjacent to the fourth active area, each row of the first and second rows of dummy ROM bits includes three dummy ROM bits positioned along the corresponding one of the fifth or sixth active areas, the fifth gate electrode is further shared by the second dummy ROM bit of each of the first and second rows of dummy ROM bits and the sixth gate electrode is further shared by the third dummy ROM bit of each of the first and second rows of dummy ROM bits, a seventh gate electrode shared by the first dummy ROM bit of each of the first and second rows of dummy ROM bits, ninth and tenth metal lines aligned with the fifth and sixth active areas in the first direction and positioned in the first frontside metal layer, and eleventh and twelfth metal lines aligned with the fifth and sixth active areas in the first direction and positioned in the first backside metal layer. In some embodiments, the first through fourth metal lines include the bit lines, the ninth and tenth metal lines include dummy bit lines of the ROM array, the fifth through eighth, eleventh, and twelfth metal lines include the source lines, and each dummy ROM bit includes first and second backside via structures positioned between the corresponding fifth or sixth active area and the corresponding eleventh or twelfth metal line. In some embodiments, the first through fourth, ninth, and tenth metal lines include the source lines, the fifth through eighth metal lines include the bit lines, the eleventh and twelfth metal lines include dummy bit lines of the ROM array, and each dummy ROM bit includes first and second frontside via structures positioned between the corresponding fifth or sixth active area and the corresponding ninth or tenth metal line. In some embodiments, the ROM array includes first through fourth gate electrodes shared by the respective first through fourth ROM bits of each of the first and second rows of ROM bits, wherein the first through fourth gate electrodes are electrically connected to respective first through fourth word lines through respective first through fourth gate vias, and fifth through eighth gate electrodes shared by the respective first through fourth ROM bits of each of the third and fourth rows of ROM bits, wherein the fifth through eighth gate electrodes are electrically connected to the respective first through fourth word lines through respective fifth through eighth gate vias. In some embodiments, the first through fourth gate electrodes are continuous with the respective fifth through eighth gate electrodes.

In some embodiments, an IC device includes first through fourth active areas extending in a semiconductor substrate between first and second dummy gate structures, wherein each of the first through fourth active areas includes five S/D structures, a plurality of gate electrodes extending across the first through fourth active areas, wherein the plurality of gate electrodes is offset from each of the first and second dummy gate structures by a gate pitch and the first and second dummy gate structures are separated by a distance corresponding to five times the gate pitch, first through fourth metal lines aligned with the first through fourth active areas in a first direction and positioned in a first frontside metal layer of the semiconductor substrate, fifth through eighth metal lines aligned with the first through fourth active areas in the first direction and positioned in a first backside metal layer of the semiconductor substrate, a frontside via structure positioned between a first S/D structure of the five S/D structures of each of the first through fourth active areas and one of the first through fourth metal lines, and a backside via structure positioned between a second S/D structure of the five S/D structures of each of the first through fourth active areas and one of the fifth through eighth metal lines. In some embodiments, the first and second S/D structures of the five S/D structures of each of the first through fourth active areas are adjacent to a same gate electrode of the plurality of gate electrodes. In some embodiments, the plurality of gate electrodes includes first and second gate electrodes extending across each of the first through fourth active areas, third and fourth gate electrodes extending across each of the first and second active areas, and fifth and sixth gate electrodes aligned with the third and fourth gate electrodes and extending across each of the third and fourth active areas, and the IC device includes ninth through twelfth metal lines positioned in the first frontside metal layer and electrically connected through gate via structures to the first, second, fourth, and fifth gate electrodes, a first isolation structure positioned between the third and fifth gate electrodes, and a second isolation structure positioned between the fourth and sixth gate electrodes. In some embodiments, the plurality of gate electrodes includes first through fourth gate electrodes extending across each of the first and second active areas and fifth through eighth gate electrodes aligned with the first through fourth gate electrodes and extending across each of the third and fourth active areas, and the IC device includes ninth through sixteenth metal lines positioned in the first frontside metal layer and electrically connected through gate via structures to the first through eighth gate electrodes. In some embodiments, the first through fourth gate electrodes are continuous with the fifth through eighth gate electrodes.

In some embodiments, a method of manufacturing an IC device includes forming first through fourth active areas in a front side of a semiconductor substrate, forming first through fifth MD segments on each of the first through fourth active areas, constructing a plurality of gate structures, wherein the constructing the plurality of gate structures includes constructing first and second dummy gate structures over endpoints of each of the first through fourth active areas and constructing a plurality of gate electrodes extending across the first through fourth active areas, wherein the plurality of gate structures includes a gate pitch and the first and second dummy gate structures are separated by a distance corresponding to five times the gate pitch, forming a frontside via structure on an MD segment of the five MD segments on each of the first through fourth active areas, forming first through fourth metal lines in a first frontside metal layer of the semiconductor substrate and overlying the first through fourth active areas, one of the first through fourth metal lines being formed on the frontside via structure, forming a backside via structure on one of the first through fourth active areas across from an MD segment of the five MD segments on each of the first through fourth active areas, and forming fifth through eighth metal lines in a first backside metal layer of the semiconductor substrate and underlying the first through fourth active areas, one of the fifth through eighth metal lines being formed on the backside via structure. In some embodiments, forming the frontside via structure and the forming the backside via structure include forming the frontside and backside via structures adjacent to a same gate electrode of the plurality of gate electrodes. In some embodiments, constructing the plurality of gate electrodes includes constructing first and second gate electrodes across each of the first through fourth active areas, constructing third and fourth gate electrodes across each of the first and second active areas, and constructing fifth and sixth gate electrodes across each of the third and fourth active areas and separated from the third and fourth gate electrodes by isolation structures, and the method includes forming gate via structures on each of the first, second, fourth, and fifth gate electrodes and forming ninth through twelfth metal lines on the gate via structures. In some embodiments, constructing the plurality of gate electrodes includes constructing first through fourth gate electrodes extending across each of the first and second active areas and constructing fifth through eighth gate electrodes across each of the third and fourth active areas and separated from the first through fourth gate electrodes by isolation structures, and the method further includes forming gate via structures on each of the first through eighth gate electrodes and forming ninth through sixteenth metal lines on the gate via structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A read-only memory (ROM) array comprising:

first through fourth rows of four ROM bits positioned along respective first through fourth active areas in a front side of a semiconductor substrate;

first through fourth metal lines aligned with the first through fourth active areas in a first direction and positioned in a first frontside metal layer of the semiconductor substrate; and fifth through eighth metal lines aligned with the first through fourth active areas in the first direction and positioned in a first backside metal layer of the semiconductor substrate, wherein the first through fourth metal lines comprise one of bit lines or source lines of the ROM array, and the fifth through eighth metal lines comprise the other of the bit lines or the source lines of the ROM array.

2. The ROM array of claim 1, wherein each ROM bit of the four ROM bits of each row of ROM bits comprises a gate structure and two source/drain (S/D) structures adjacent to the gate structure in the corresponding active area, and three of the S/D structures of each row of ROM bits are shared by the four ROM bits.

3. The ROM array of claim 2, wherein each of the first through fourth active areas extends between first and second dummy gate structures, the first and second dummy gate structures and gate structures of each ROM bit of the four ROM bits of each row of ROM bits are spaced apart in accordance with a gate pitch, and the first and second dummy gate structures are separated by a distance corresponding to five times the gate pitch.

4. The ROM array of claim 2, wherein at least one ROM bit of the four ROM bits of each row of ROM bits further comprises:

a frontside via structure positioned between one of the two S/D structures and a corresponding one of the first through fourth metal lines; and a backside via structure positioned between the other of the two S/D structures and a corresponding one of the fifth through eighth metal lines.

5. The ROM array of claim 1, further comprising:

a first gate electrode shared by the first ROM bit of each of the first through fourth rows of ROM bits;

a second gate electrode shared by the second ROM bit of each of the first through fourth rows of ROM bits;

a third gate electrode shared by the third ROM bit of each of the first and second rows of ROM bits;

a fourth gate electrode shared by the fourth ROM bit of each of the first and second rows of ROM bits;

a fifth gate electrode shared by the third ROM bit of each of the third and fourth rows of ROM bits; and a sixth gate electrode shared by the fourth ROM bit of each of the third and fourth rows of ROM bits.

6. The ROM array of claim 5, further comprising:

fifth through eighth rows of ROM bits comprising respective fifth through eighth active areas, wherein the fifth active area is adjacent to the fourth active area, each of the fifth through eighth rows of ROM bits comprises four ROM bits positioned along the corresponding one of the fifth through eighth active areas, the fifth gate electrode is further shared by the third ROM bit of each of the fifth and sixth rows of ROM bits, and the sixth gate electrode is further shared by the fourth ROM bit of each of the fifth and sixth rows of ROM bits;

a seventh gate electrode shared by the first ROM bit of each of the fifth through eighth rows of ROM bits;

an eighth gate electrode shared by the second ROM bit of each of the fifth through eighth rows of ROM bits;

a ninth gate electrode shared by the third ROM bit of each of the seventh and eighth rows of ROM bits;

a tenth gate electrode shared by the fourth ROM bit of each of the seventh and eighth rows of ROM bits;

ninth through twelfth metal lines aligned with the fifth through eighth active areas in the first direction and comprising the one of the bit lines or the source lines positioned in the first frontside metal layer; and thirteenth through sixteenth metal lines aligned with the fifth through eighth active areas in the first direction and comprising the other of the bit lines or the source lines positioned in the first backside metal layer.

7. The ROM array of claim 5, further comprising:

first and second rows of dummy ROM bits comprising respective fifth and sixth active areas, wherein the fifth active area is adjacent to the fourth active area, each row of the first and second rows of dummy ROM bits comprises three dummy ROM bits positioned along the corresponding one of the fifth or sixth active areas, the fifth gate electrode is further shared by the second dummy ROM bit of each of the first and second rows of dummy ROM bits, and the sixth gate electrode is further shared by the third dummy ROM bit of each of the first and second rows of dummy ROM bits;

a seventh gate electrode shared by the first dummy ROM bit of each of the first and second rows of dummy ROM bits;

ninth and tenth metal lines aligned with the fifth and sixth active areas in the first direction and positioned in the first frontside metal layer; and eleventh and twelfth metal lines aligned with the fifth and sixth active areas in the first direction and positioned in the first backside metal layer.

8. The ROM array of claim 7, wherein the first through fourth metal lines comprise the bit lines, the ninth and tenth metal lines comprise dummy bit lines of the ROM array, the fifth through eighth, eleventh, and twelfth metal lines comprise the source lines, and each dummy ROM bit comprises first and second backside via structures positioned between the corresponding fifth or sixth active area and the corresponding eleventh or twelfth metal line.

9. The ROM array of claim 7, wherein the first through fourth, ninth, and tenth metal lines comprise the source lines, the fifth through eighth metal lines comprise the bit lines, the eleventh and twelfth metal lines comprise dummy bit lines of the ROM array, and each dummy ROM bit comprises first and second frontside via structures positioned between the corresponding fifth or sixth active area and the corresponding ninth or tenth metal line.

10. The ROM array of claim 1, further comprising:

first through fourth gate electrodes shared by the respective first through fourth ROM bits of each of the first and second rows of ROM bits, wherein the first through fourth gate electrodes are electrically connected to respective first through fourth word lines through respective first through fourth gate vias; and fifth through eighth gate electrodes shared by the respective first through fourth ROM bits of each of the third and fourth rows of ROM bits, wherein the fifth through eighth gate electrodes are electrically connected to the respective first through fourth word lines through respective fifth through eighth gate vias.

11. The ROM array of claim 10, wherein the first through fourth gate electrodes are continuous with the respective fifth through eighth gate electrodes.

12. An integrated circuit (IC) device comprising:

first through fourth active areas extending in a semiconductor substrate between first and second dummy gate structures, wherein each of the first through fourth active areas comprises five source/drain (S/D) structures;

a plurality of gate electrodes extending across the first through fourth active areas, wherein the plurality of gate electrodes is offset from each of the first and second dummy gate structures by a gate pitch, and the first and second dummy gate structures are separated by a distance corresponding to five times the gate pitch;

first through fourth metal lines aligned with the first through fourth active areas in a first direction and positioned in a first frontside metal layer of the semiconductor substrate;

fifth through eighth metal lines aligned with the first through fourth active areas in the first direction and positioned in a first backside metal layer of the semiconductor substrate;

a frontside via structure positioned between a first S/D structure of the five S/D structures of each of the first through fourth active areas and one of the first through fourth metal lines; and a backside via structure positioned between a second S/D structure of the five S/D structures of each of the first through fourth active areas and one of the fifth through eighth metal lines.

13. The IC device of claim 12, wherein the first and second S/D structures of the five S/D structures of each of the first through fourth active areas are adjacent to a same gate electrode of the plurality of gate electrodes.

14. The IC device of claim 12, wherein the plurality of gate electrodes comprises:

first and second gate electrodes extending across each of the first through fourth active areas;

third and fourth gate electrodes extending across each of the first and second active areas; and fifth and sixth gate electrodes aligned with the third and fourth gate electrodes and extending across each of the third and fourth active areas, and the IC device further comprises:

ninth through twelfth metal lines positioned in the first frontside metal layer and electrically connected through gate via structures to the first, second, fourth, and fifth gate electrodes;

a first isolation structure positioned between the third and fifth gate electrodes; and a second isolation structure positioned between the fourth and sixth gate electrodes.

15. The IC device of claim 12, wherein the plurality of gate electrodes comprises:

first through fourth gate electrodes extending across each of the first and second active areas; and fifth through eighth gate electrodes aligned with the first through fourth gate electrodes and extending across each of the third and fourth active areas, and the IC device further comprises ninth through sixteenth metal lines positioned in the first frontside metal layer and electrically connected through gate via structures to the first through eighth gate electrodes.

16. The IC device of claim 15, wherein the first through fourth gate electrodes are continuous with the fifth through eighth gate electrodes.

17. A method of manufacturing an integrated circuit (IC) device, the method comprising:

forming first through fourth active areas in a front side of a semiconductor substrate;

forming first through fifth metal-like defined (MD) segments on each of the first through fourth active areas;

constructing a plurality of gate structures, wherein the constructing the plurality of gate structures comprises:

constructing first and second dummy gate structures over endpoints of each of the first through fourth active areas; and constructing a plurality of gate electrodes extending across the first through fourth active areas, wherein the plurality of gate structures comprises a gate pitch, and the first and second dummy gate structures are separated by a distance corresponding to five times the gate pitch;

forming a frontside via structure on an MD segment of the five MD segments on each of the first through fourth active areas;

forming first through fourth metal lines in a first frontside metal layer of the semiconductor substrate and overlying the first through fourth active areas, one of the first through fourth metal lines being formed on the frontside via structure;

forming a backside via structure on one of the first through fourth active areas across from an MD segment of the five MD segments on each of the first through fourth active areas; and forming fifth through eighth metal lines in a first backside metal layer of the semiconductor substrate and underlying the first through fourth active areas, one of the fifth through eighth metal lines being formed on the backside via structure.

18. The method of claim 17, wherein the forming the frontside via structure and the forming the backside via structure comprise forming the frontside and backside via structures adjacent to a same gate electrode of the plurality of gate electrodes.

19. The method of claim 17, wherein the constructing the plurality of gate electrodes comprises:

constructing first and second gate electrodes across each of the first through fourth active areas;

constructing third and fourth gate electrodes across each of the first and second active areas; and constructing fifth and sixth gate electrodes across each of the third and fourth active areas and separated from the third and fourth gate electrodes by isolation structures, and the method further comprises:

forming gate via structures on each of the first, second, fourth, and fifth gate electrodes; and forming ninth through twelfth metal lines on the gate via structures.

20. The method of claim 17, wherein the constructing the plurality of gate electrodes comprises:

constructing first through fourth gate electrodes extending across each of the first and second active areas; and constructing fifth through eighth gate electrodes across each of the third and fourth active areas and separated from the first through fourth gate electrodes by isolation structures, and the method further comprises:

forming gate via structures on each of the first through eighth gate electrodes; and forming ninth through sixteenth metal lines on the gate via structures.

* * * * *